(12) United States Patent
Kubo et al.

(10) Patent No.: US 12,557,247 B2
(45) Date of Patent: Feb. 17, 2026

(54) COOLING DEVICE

(71) Applicant: Fujitsu Limited, Kawasaki (JP)

(72) Inventors: Hideo Kubo, Kawasaki (JP); Atsushi Endo, Kawasaki (JP); Masahide Kodama, Kawasaki (JP); Nobumitsu Aoki, Kawasaki (JP); Kenji Sasabe, Kawasaki (JP); Keita Hirai, Kawasaki (JP); Yuki Kanai, Kawasaki (JP); Toru Kobayashi, Kawasaki (JP); Hiroshi Satou, Kawasaki (JP); Takashi Urai, Kawasaki (JP); Hiromasa Miyata, Sumida (JP)

(73) Assignee: Fujitsu Limited, Kawasaki (JP)

( * ) Notice: Subject to any disclaimer, the term of this patent is extended or adjusted under 35 U.S.C. 154(b) by 263 days.

(21) Appl. No.: 18/136,415

(22) Filed: Apr. 19, 2023

(65) Prior Publication Data
US 2024/0032251 A1    Jan. 25, 2024

(30) Foreign Application Priority Data

Jul. 25, 2022   (JP) .................................. 2022-118296

(51) Int. Cl.
*H05K 7/20*        (2006.01)
(52) U.S. Cl.
CPC ....... *H05K 7/2039* (2013.01); *H05K 7/20309* (2013.01); *H05K 7/20318* (2013.01)
(58) Field of Classification Search
CPC ........... H05K 7/20318; H05K 7/20336; H05K 7/20663; H05K 7/20309; H05K 7/2039
See application file for complete search history.

(56) References Cited

U.S. PATENT DOCUMENTS

| | | | | |
|---|---|---|---|---|
| 10,352,626 | B2* | 7/2019 | Kurashima | ............ F28D 15/046 |
| 10,497,640 | B2* | 12/2019 | Kurashima | ........ H05K 7/20336 |
| 11,058,031 | B2* | 7/2021 | Numoto | .................. F28D 15/04 |
| 2009/0025910 | A1* | 1/2009 | Hoffman | ................ F28D 15/046 |
| | | | | 165/104.21 |
| 2010/0252237 | A1* | 10/2010 | Hashimoto | ........... H01L 23/427 |
| | | | | 165/104.21 |

(Continued)

FOREIGN PATENT DOCUMENTS

| | | |
|---|---|---|
| CN | 107509357 A  *  12/2017 | |
| JP | 2002-267378 A     9/2002 | |

(Continued)

OTHER PUBLICATIONS

CN-107509357-A Translation (Year: 2017).*

(Continued)

*Primary Examiner* — Jayprakash N Gandhi
*Assistant Examiner* — Matthew Sinclair Muir
(74) *Attorney, Agent, or Firm* — WHDA, LLP

(57) ABSTRACT

A cooling device includes a container in which refrigerant is sealed. The container includes; a heat reception plate that forms part of the container and that receives heat from a heat generating element; an evaporator that causes the refrigerant in a liquid phase to evaporate with heat reception in the container; a condenser that causes the refrigerant in a gas phase to condense with heat dissipation in the container; and a plurality of recessed portions formed in a surface of the heat reception plate inside the container.

14 Claims, 22 Drawing Sheets

(56) References Cited

U.S. PATENT DOCUMENTS

| | | | |
|---|---|---|---|
| 2019/0013257 A1 | 1/2019 | Kurashima | |
| 2020/0045847 A1* | 2/2020 | Wakaoka | H05K 7/20336 |
| 2020/0355444 A1* | 11/2020 | Chen | F28D 15/046 |
| 2021/0360822 A1* | 11/2021 | Huang | H05K 7/20336 |
| 2021/0372707 A1 | 12/2021 | Kubo et al. | |
| 2023/0121930 A1* | 4/2023 | Mao | F28D 15/046 |
| | | | 165/104.26 |

FOREIGN PATENT DOCUMENTS

| | | |
|---|---|---|
| JP | 2018-096669 A | 6/2018 |
| JP | 2018-204882 A | 12/2018 |
| JP | 2019-015420 A | 1/2019 |
| JP | 2021-190479 A | 12/2021 |

OTHER PUBLICATIONS

Office Action dated Dec. 2, 2025, issued in counterpart JP Application No. 2022-118296, with English translation. (8 pages).

* cited by examiner

COOLING DEVICE

CROSS-REFERENCE TO RELATED APPLICATION

This application is based upon and claims the benefit of priority of the prior Japanese Patent Application No. 2022-118296, filed on Jul. 25, 2022, the entire contents of which are incorporated herein by reference.

FIELD

The technique disclosed herein is related to a cooling device.

BACKGROUND

There is a cooling device that includes, in a container in which refrigerant is sealed, an evaporation unit that causes the liquid-phase refrigerant to evaporate with heat reception, a condensation unit that causes the gas-phase refrigerant to condense with heat dissipation in the container, and a tubular transport unit that transports the refrigerant in the container to the evaporation unit by a capillary phenomenon. There also is a boiling and cooling device in which a heat transfer wall unit corresponding to a position of a heat generating element of a heat reception unit includes an irregular surface and a metal porous body. The irregular surface has a plurality of grooves extending along an inner wall surface of the heat reception unit. The metal porous body is attached to the irregular surface such that the metal porous body is superposed on the irregular surface in a state in which at least a subset of the grooves of the irregular surface is open to an inner space. The metal porous body has a plurality of through holes extending in one direction and is attached such that one opening of the through holes faces the irregular surface and an other opening is open to the inner space.

Japanese Laid-open Patent Publication Nos. 2021-190479 and 2018-204882 are disclosed as related art.

SUMMARY

According to an aspect of the embodiments, a cooling device includes: a container in which refrigerant is sealed; a heat reception plate that forms part of the container and that receives heat from a heat generating element; an evaporator that causes the refrigerant in a liquid phase to evaporate with heat reception in the container; a condenser that causes the refrigerant in a gas phase to condense with heat dissipation in the container; and a plurality of recessed portions formed in a surface of the heat reception plate inside the container.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The cooling device that causes heat transfer through evaporation and condensation of the refrigerant in the container in which the refrigerant is sealed may facilitate evaporation of the refrigerant, and thereby the heat may be efficiently transported to improve cooling efficiency. There is room to improve the structure of the cooling device that may facilitate evaporation of the refrigerant in the container.

As one aspect, the technique disclosed herein is aimed at facilitating evaporation of refrigerant in a cooling device that causes heat transfer through evaporation and condensation of the refrigerant in a container to improve cooling efficiency.

A cooling device according to a first embodiment is described in detail with reference to the drawings.

Figure 1:
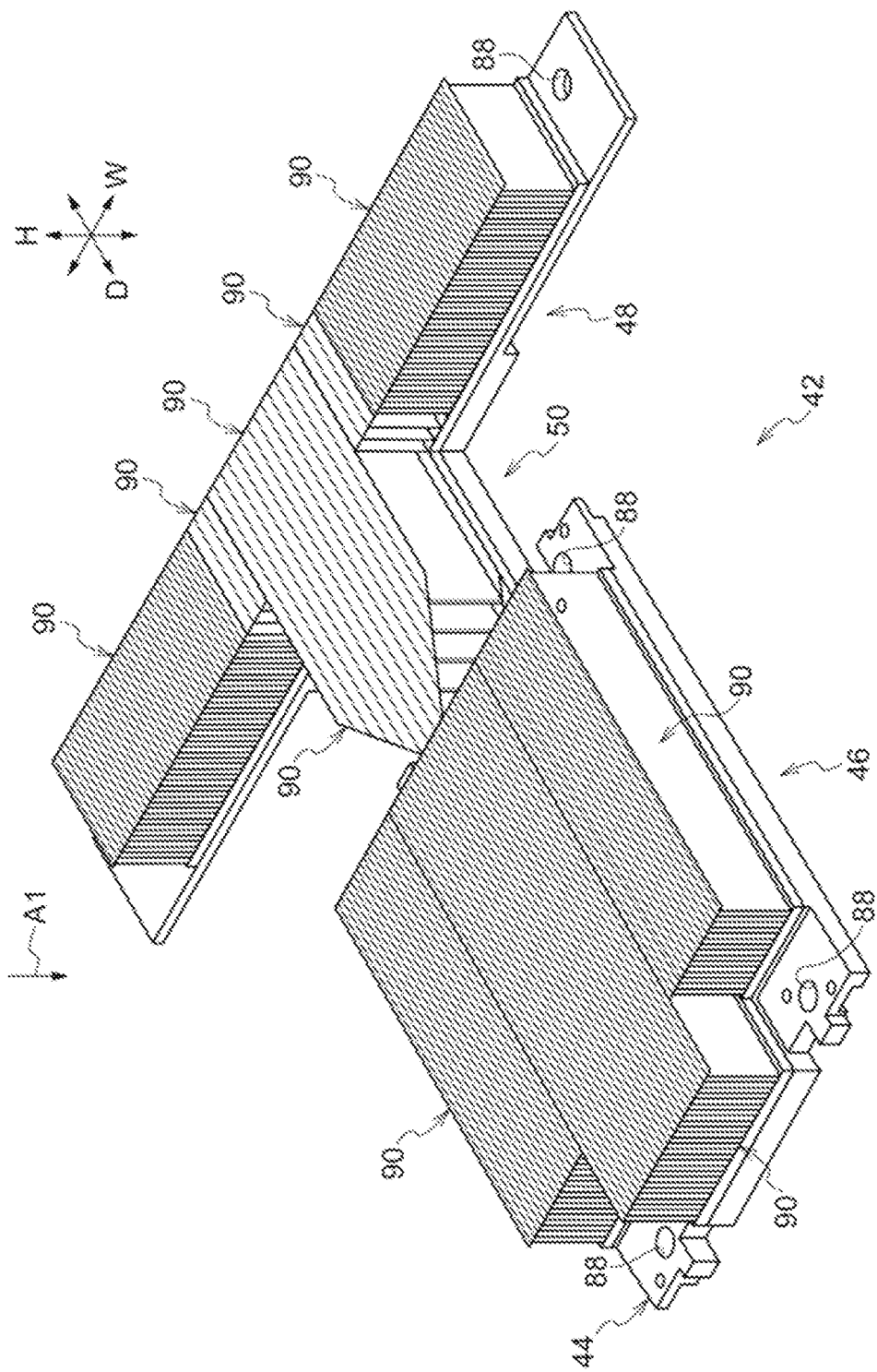
FIG. 1 is a perspective view illustrating a cooling device according to a first embodiment.
Figure 2:
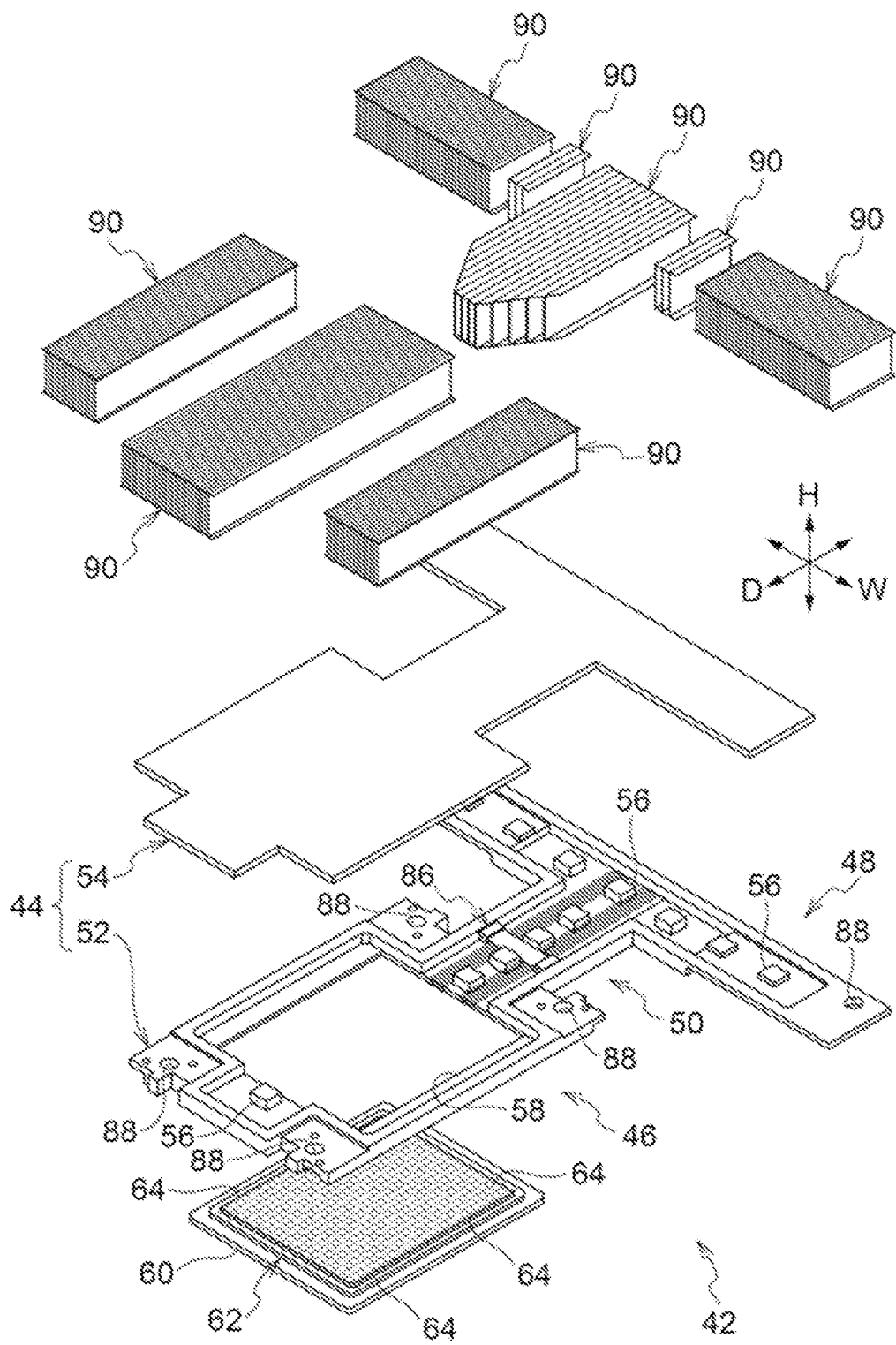
FIG. 2 is an exploded perspective view illustrating the cooling device according to the first embodiment.
Figure 3:
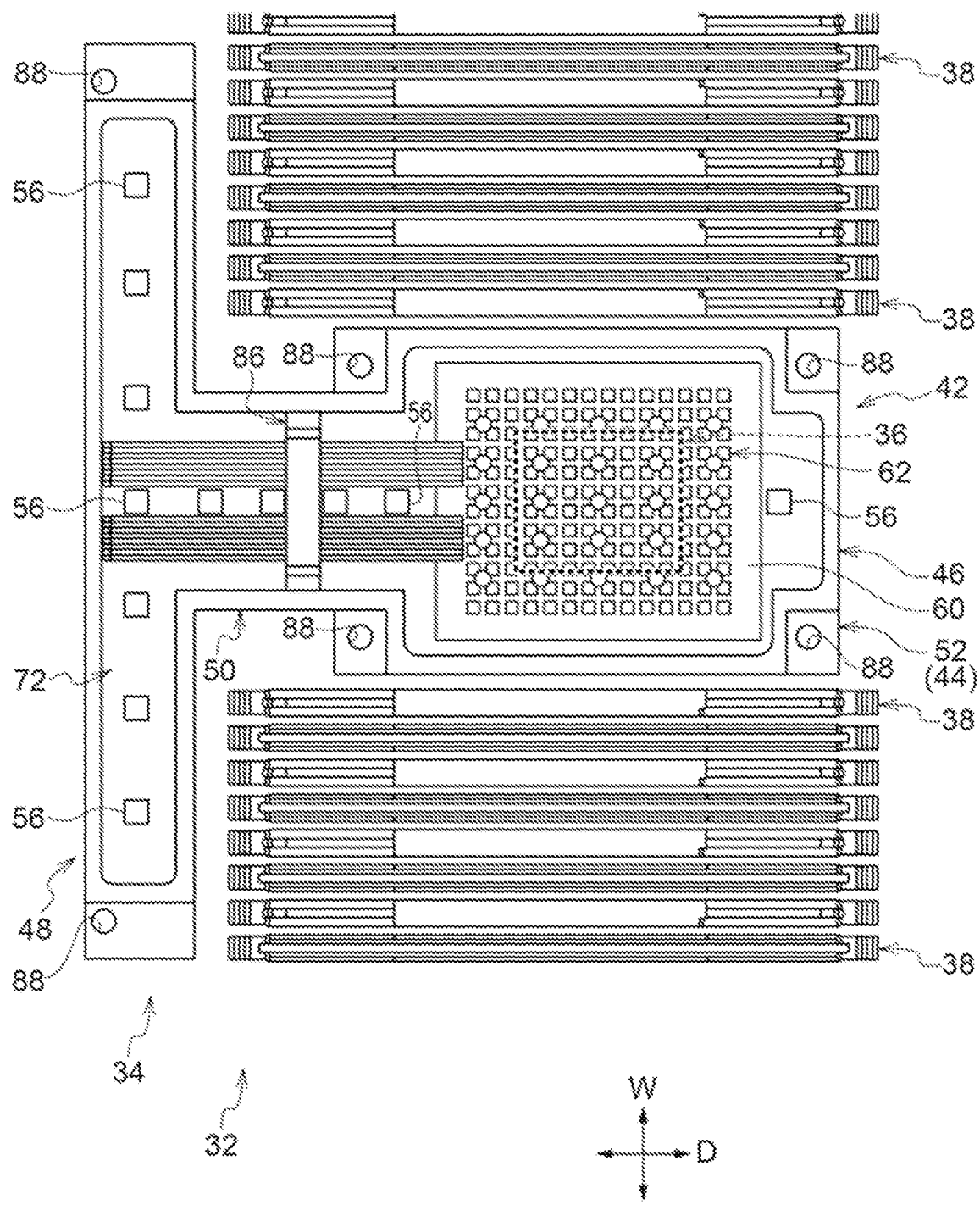
FIG. 3 is a plan view illustrating part of an electronic apparatus including the cooling device according to the first embodiment together with an internal structure of the cooling device.

FIGS. 1 and 2 illustrate the cooling device 42 according to the first embodiment. FIG. 3 illustrates an electronic apparatus 32 including the cooling device 42. Although examples of the electronic apparatus 32 may include an information communication apparatus such as a server, it is not limiting.

Figure 5:
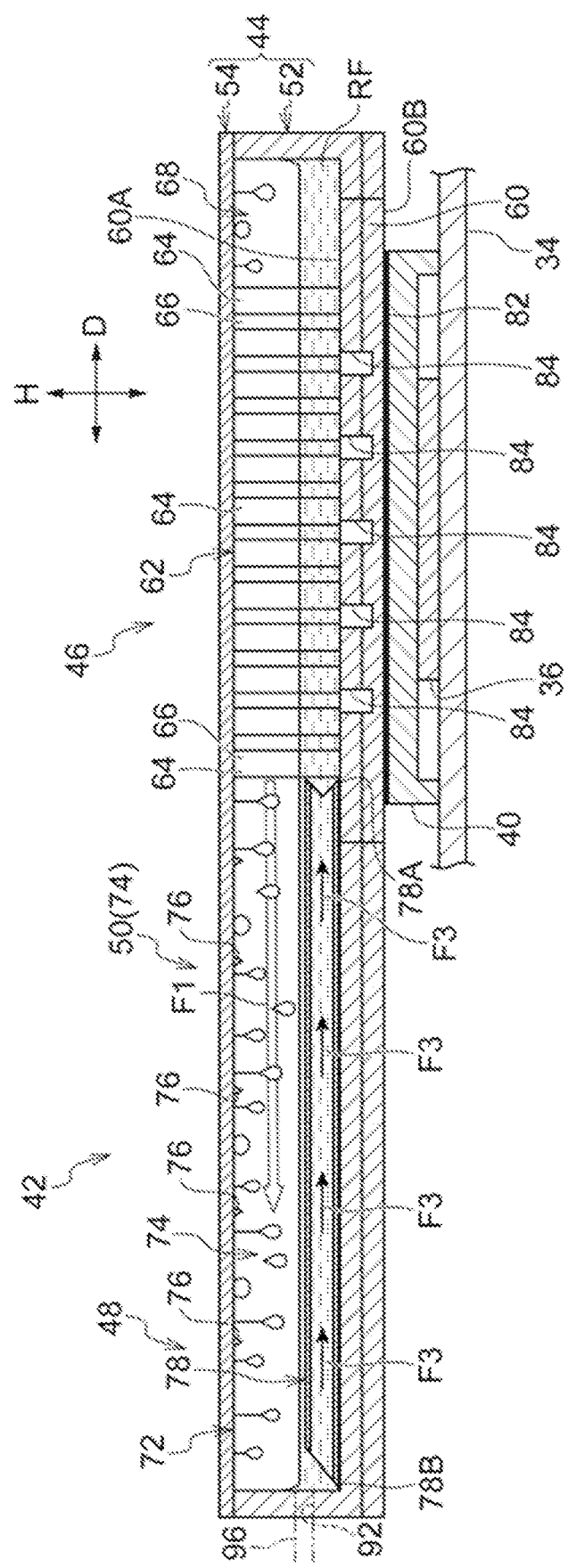
FIG. 5 is a sectional view illustrating the cooling device according to the first embodiment taken along line V-V of FIG. 4.
Figure 8:
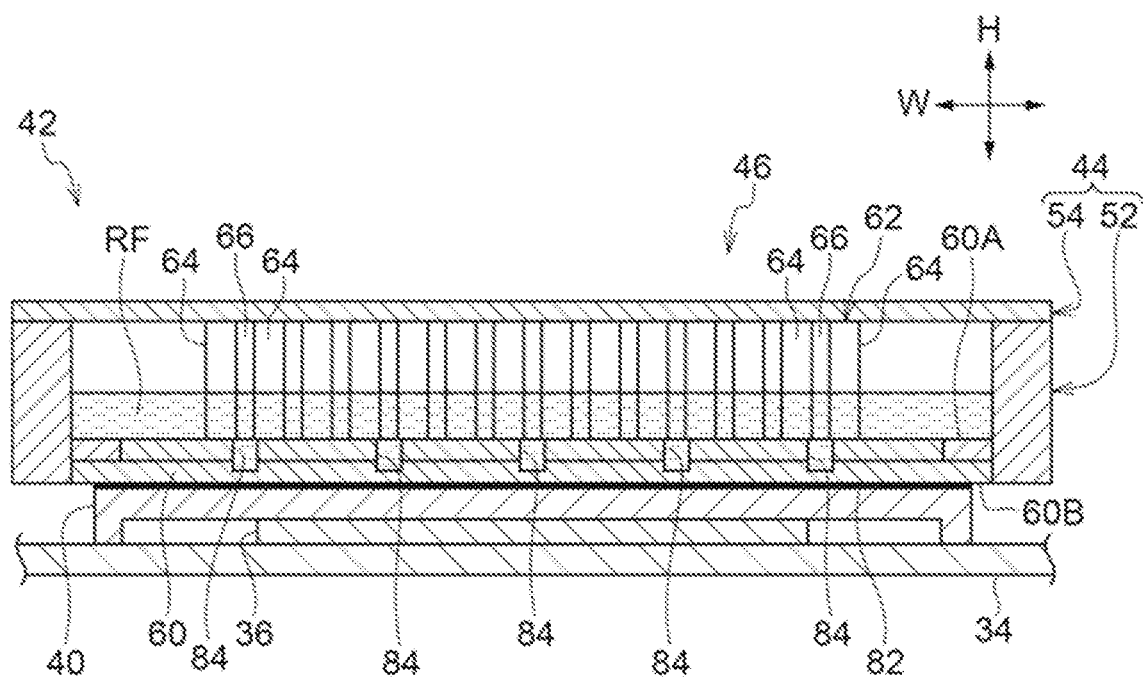
FIG. 8 is a sectional view illustrating the cooling device according to the first embodiment taken along line VIII-VIII of FIG. 4.

The electronic apparatus 32 includes a substrate 34 having rigidity and insulating properties. A plurality of elements 36 and 38 are mounted over the substrate 34. Although the types of the elements 36 and 38 are not particularly limited, according to the present embodiment, the element 36 is a processor chip, and the elements 38 are memory chips. In this case, the element 36 is an example of a heat generating element. The cooling device 42 is disposed for the element 36 to cool the element 36. As illustrated in FIGS. 5 and 8, the element 36 is housed in a package 40. The element 36 is electrically coupled to the substrate 34 with, for example, a so-called land grid array (LGA) that uses a plurality of lands.

As illustrated in FIGS. 1 to 5, the cooling device 42 includes a container 44. Refrigerant RF is sealed in the container 44 (see FIG. 5). The cooling device 42 includes a heat reception unit 46, a heat dissipation unit 48, and a coupling unit 50.

The type of the refrigerant RF is not limited as long as the refrigerant RF may transfer heat when the refrigerant RF is circulated while phase transition between a liquid phase and a gas phase is performed in the container 44. For example, water may be used as the refrigerant RF. Oil or alcohol may be used other than water. However, water is easily available and easily handled. Thus, water is used according to the present embodiment.

As illustrated in FIGS. 5 and 8, the heat reception unit 46 is a portion that receives heat of the element 36. An evaporation unit 62 that vaporizes the liquid-phase refrigerant RF with the heat is provided in the heat reception unit 46.

As illustrated in FIGS. 5 and 8, a heat reception plate 60 is formed in a plate shape. Although the heat reception plate 60 includes two plate materials stacked one on top of another according to the technique of the present disclosure, the heat reception plate 60 may be a single plate material. The heat reception plate 60 is a portion that is disposed so as to be in contact with the package 40 with the thermal bonding material 82 interposed therebetween and receives the heat of the element 36. As the thermal bonding material 82, for example, grease, a thermal conductive sheet, or the like having thermal conductivity is used. Close contact between the package 40 and the heat reception plate 60 is improved by the thermal bonding material 82, and the heat may be efficiently transferred from the package 40 to the heat reception plate 60.

The evaporation unit 62 that causes the liquid-phase refrigerant RF to vaporize with the heat is provided in the heat reception unit 46.

Figure 4:
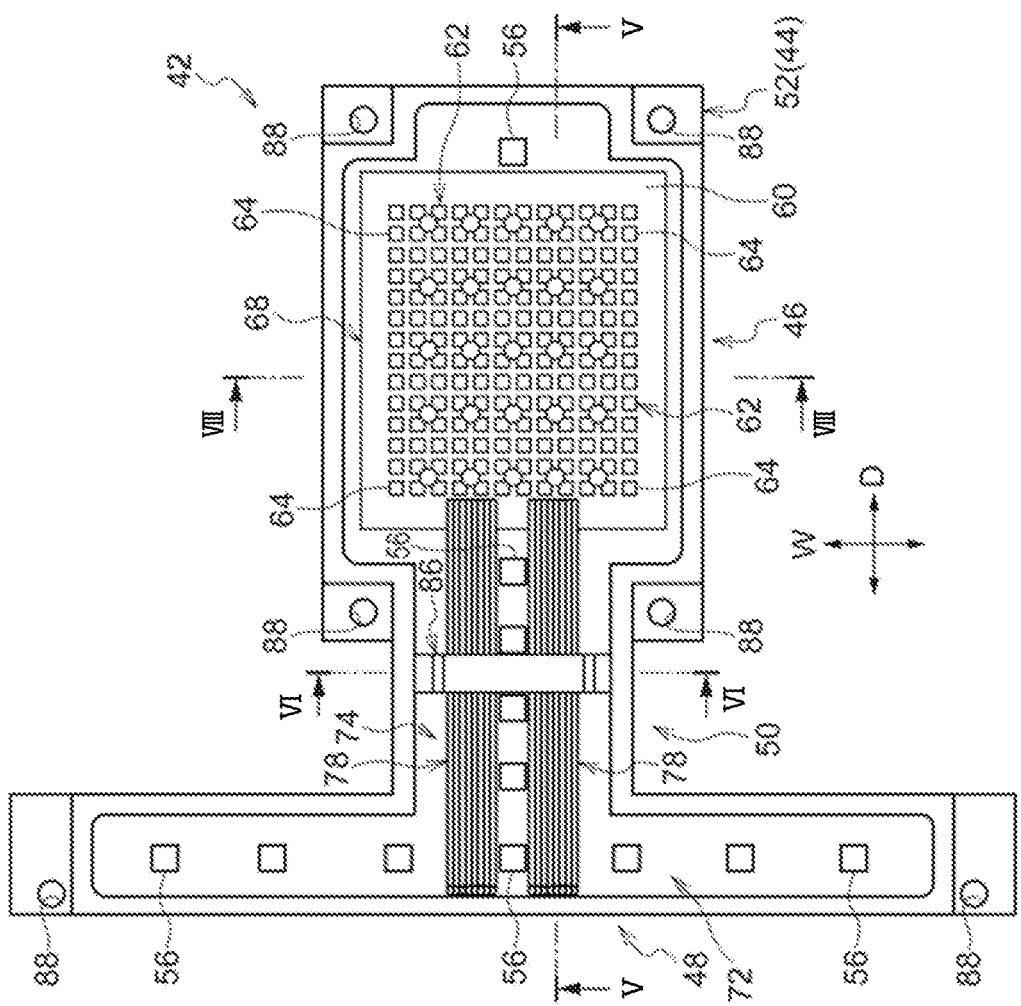
FIG. 4 is a plan view illustrating an inner structure of the cooling device according to the first embodiment.

As illustrated in FIGS. 4 and 5, the heat dissipation unit 48 is disposed so as to be separate from the heat reception unit 46. The heat dissipation unit 48 is a portion that dissipates, to the outside, the heat of the refrigerant RF sealed in the container 44. A condensation unit (or simply, condenser) 72 that liquefies the gas-phase refrigerant RF with heat dissipation is provided in the heat dissipation unit 48.

The coupling unit 50 is a portion that couples the evaporation unit 62 and the heat dissipation unit 48 to each other. The coupling unit 50 also serves as a movement region 74 through which the refrigerant RF moves between the evaporation unit 62 and the condensation unit 72. Part of thermal energy of the gas-phase refrigerant RF is discharged to the outside also in the coupling unit 50, and the refrigerant RF is liquefied.

In the drawings, the width direction, the depth direction, and the height direction of the container 44 are respectively indicated by arrows W, D, and H. According to the present embodiment, the heat dissipation unit 48 has a shape that is greater in the width direction and smaller in the depth direction than the evaporation unit 62. The coupling unit 50 is smaller than the evaporation unit 62 in the width direction and has a depth for coupling the heat reception unit 46 and the heat dissipation unit 48 to each other.

As illustrated in FIG. 2, the container 44 has a structure in which two plate materials which include a bottom plate 52 and a top plate 54 are stacked in the thickness direction (height direction) and fixed to each other.

As illustrated in FIGS. 2 to 4, a plurality of struts 56 stand erect from the bottom plate 52. Distal ends (upper ends) of the struts 56 are in contact with the top plate 54, and the top plate 54 is supported by the struts 56. The inside of the container 44 is maintained in a low pressure state. However, even in the low pressure state, the struts 56 maintain the spacing between the top plate 54 and the bottom plate 52 and ensure the volume of the inside of the container 44.

According to the present embodiment, as illustrated in FIGS. 2 and 4, a plurality of the struts 56 are arranged at intervals in the width direction of the container 44 in the heat dissipation unit 48, and a plurality of the struts 56 are arranged at intervals in the depth direction of the container 44 in the coupling unit 50. In addition, in the heat reception unit 46, a single strut 56 is provided on the opposite side from the coupling unit 50 side with the evaporation unit 62 interposed therebetween.

As illustrated in FIG. 2, an opening 58 is formed in a portion corresponding to the heat reception plate 60 in the bottom plate 52. When the heat reception plate 60 is fitted into the opening 58, a sealing structure in the container 44 is realized by the bottom plate 52, the top plate 54, and the heat reception plate 60.

A plurality of pillar members 64 stand erect over the heat reception plate 60 toward the top plate 54. As illustrated in detail in FIGS. 5 and 7, the plurality of pillar members 64 are arranged at regular intervals in the width direction and the depth direction, and groove portions 66 arranged in a grid shape are formed between the pillar members 64. A groove width of the groove portions 66 is smaller than an inner diameter of transport pipes 78, which will be described later.

As illustrated in FIG. 5, in the groove portions 66, vaporization of the liquid-phase refrigerant RF is facilitated by the heat from the heat reception plate 60. The "vaporization" in the groove portions 66 includes not only "evaporation" with which the refrigerant RF vaporizes from the surface of the refrigerant RF but also "boiling" with which the refrigerant RF vaporizes from the inside of the refrigerant RF. A portion provided with the pillar members 64 is a portion where the liquid-phase refrigerant RF evaporates as described above and is the evaporation unit 62.

The distal ends of the pillar members 64 are in contact with the top plate 54. Also with this structure, in the low pressure state inside the container 44, the spacing between the top plate 54 and the bottom plate 52 is maintained and the volume of the inside of the container 44 is ensured.

As illustrated in FIG. 4, a diffusion region 68 is formed between the top plate 54 and the bottom plate 52 around the pillar members 64. The gas-phase refrigerant RF having evaporated in the evaporation unit 62 diffuses into the diffusion region 68.

The movement region 74 is formed between the top plate 54 and the bottom plate 52 between the heat reception unit 46 and the heat dissipation unit 48. The gas-phase refrigerant RF having evaporated in the evaporation unit 62 moves to the heat dissipation unit 48 via the movement region 74. During this movement, the heat of the refrigerant RF is discharged to the outside of the container 44. Thus, the gas-phase refrigerant RF condenses and liquefies. For example, the coupling unit 50 and the heat dissipation unit 48 are also a portion where the gas-phase refrigerant RF condenses as described above.

A plurality of projections 76 are formed over the top plate 54 toward the bottom plate 52. Each of the projections 76 has a shape tapering toward the distal end side. When such projections 76 are provided, the surface area of the top surface of the condensation unit 72 increases compared to a structure without the projections 76.

Figure 6:
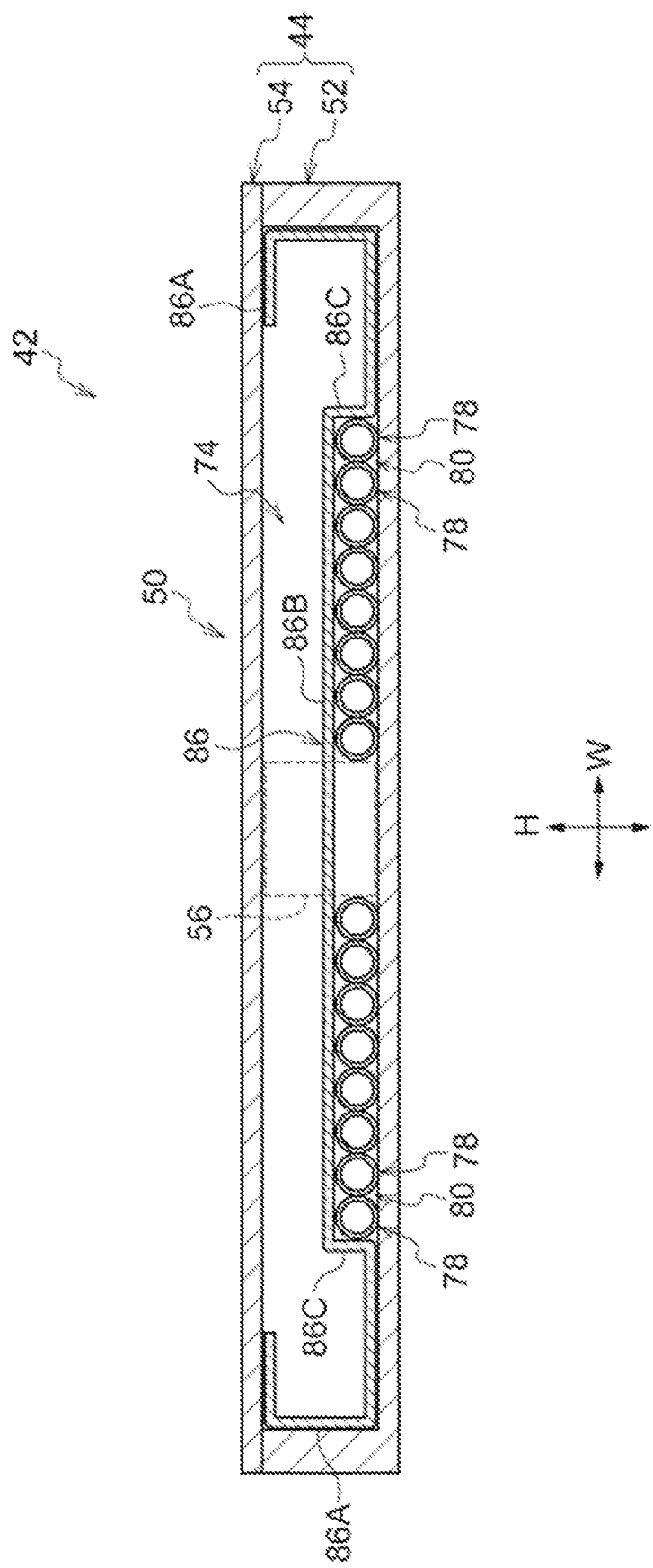
FIG. 6 is a sectional view illustrating the cooling device according to the first embodiment taken along line VI-VI of FIG. 4.

As illustrated in FIGS. 4 to 6, the transport pipes 78 extending in the depth direction are disposed inside the container 44. Although a single transport pipe 78 may be sufficient, according to the present embodiment, a plurality of the transport pipes 78 are disposed (in the example illustrated in FIG. 6, a total of 16 transport pipes 78 including two sets of the transport pipes 78, which each includes eight transport pipes 78 arranged adjacent to each other in the width direction, disposed with the struts 56 interposed therebetween are disposed). The longitudinal direction of the transport pipes 78 coincides with the depth direction (arrow D direction) of the container 44.

The inner diameter of the transport pipes 78 is set to a diameter so as to allow the liquid-phase refrigerant RF to be transported by a capillary phenomenon and a sufficient amount of the refrigerant RF to be transported to the evaporation unit 62 through the entirety of the plurality of transport pipes 78. The transport pipes 78 are examples of a transport unit through which the liquid-phase refrigerant RF is transported to the evaporation unit 62 by the capillary phenomenon.

An upper limit of the inner diameter of the transport pipes 78 is determined so that, even in a case where the cooling device 42 is inclined such that one end portion 78A is higher than an other end portion 78B, the refrigerant RF may be transported from the other end portion 78B to the one end portion 78A by the capillary phenomenon.

According to the present embodiment, as illustrated in FIG. 6, spaces 80 formed between the transport pipes 78 arranged adjacent to each other in the width direction and the bottom plate 52 also serve as regions through which the liquid-phase refrigerant RF may be transported by the capillary phenomenon.

As illustrated in FIGS. 5 and 8, a plurality of recessed portions 84 are formed in the heat reception plate 60. These recessed portions 84 are formed in an upper surface 60A of the heat reception plate 60, for example, in the inner surface the container 44. Each of the plurality of recessed portions 84 has a shape that does not extend through the heat reception plate 60, for example, a shape that does not reach the outer surface of the container 44.

Figure 7:
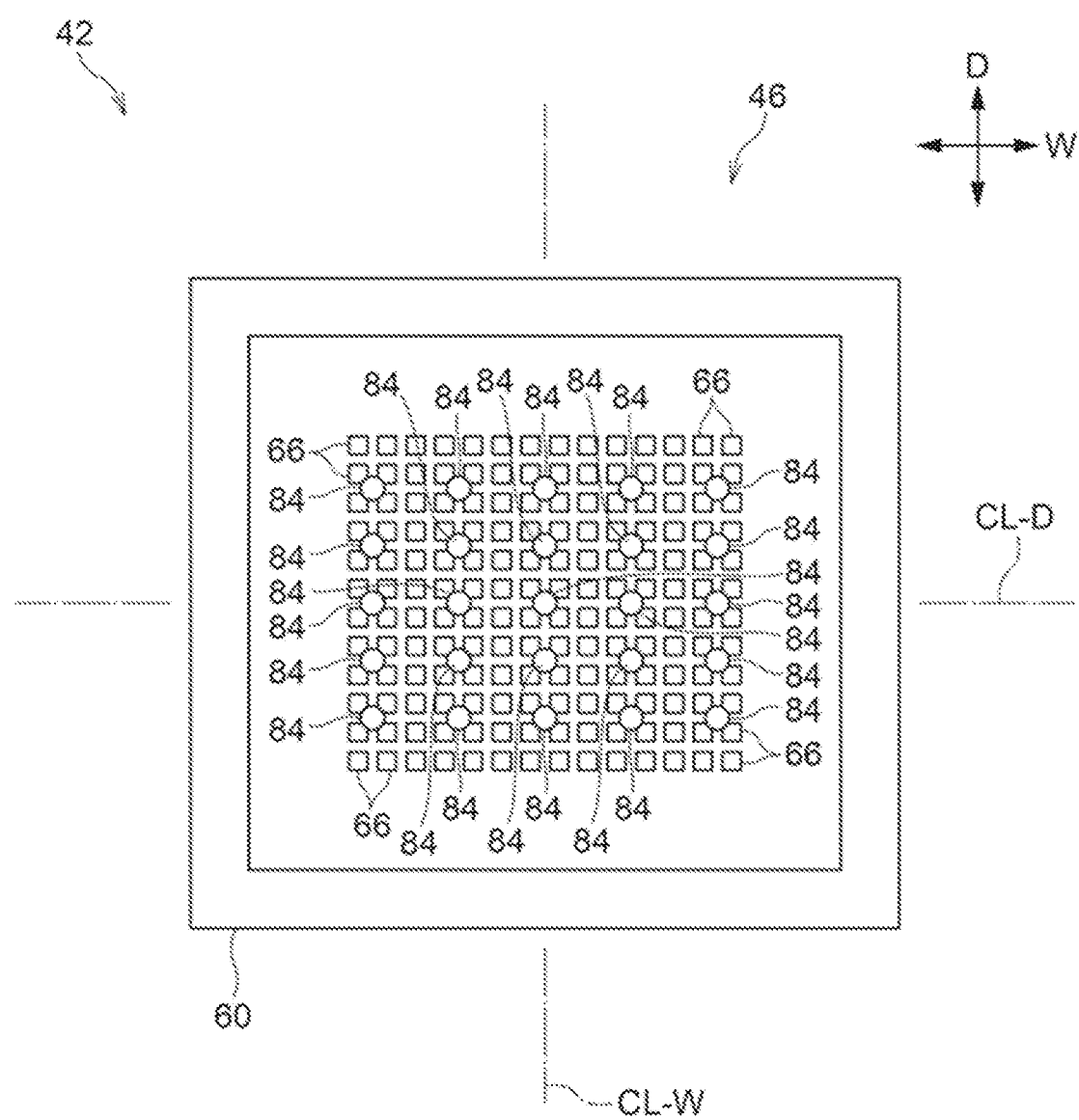
FIG. 7 is an enlarged plan view illustrating the vicinity of a heat reception unit of the cooling device according to the first embodiment.

As illustrated in FIG. 7, each of the plurality of recessed portions 84 has a closed shape open to none of the four sides of the heat reception plate 60 in plan view of the heat reception plate 60. Accordingly, when the heat reception plate 60 is seen in plan view, the recessed portion 84 is located at an inner position than the four sides of the heat reception plate 60. For example, according to the first embodiment, the recessed portion 84 has a columnar shape. For example, the recessed portion 84 has a circular section having a fixed inner diameter regardless of the position in the up-down direction.

Each of the plurality of recessed portions 84 is formed at a position of an intersection of the plurality of groove portions 66. According to the first embodiment, the plurality of recessed portions 84 are symmetrically disposed with respect to a center line CL-W in the width direction and with respect to a center line CL-D in the depth direction in a case where the heat reception plate 60 is seen in plan view. An example illustrated in FIG. 7 is an example of arrangement of the plurality of recessed portions 84. A total of 25 recessed portions 84 arranged in five rows in the width direction and five rows in the depth direction are illustrated. Of course, the number or the arrangement of the plurality of recessed portions 84 is not limited to this.

As illustrated in FIGS. 2 to 4, a securing tool 86 is disposed at a portion of the coupling unit 50 inside the container 44. As illustrated in FIG. 6, the securing tool 86 includes fitting portions 86A that are fitted to a space between the top plate 54 and the bottom plate 52 on both sides in the width direction (arrow W direction) and a pressing portion 86B that presses the plurality of transport pipes 78 toward the bottom plate 52 at the center in the width direction. The transport pipes 78 are pressed against and secured to the bottom plate 52 by the pressing portion 86B. Since the plurality of transport pipes 78 are in contact with and secured to the bottom plate 52, a sufficient sectional area of a flow path for the movement of the substantially gas-phase refrigerant RF is ensured between the top plate 54 and the transport pipes 78.

Since the sets of the transport pipes 78 are located between the struts 56 and side surface portions 86C of the pressing portion 86B, the sets of the transport pipes 78 are also held in the width direction.

As illustrated in FIGS. 1 to 4, fastening holes 88 are provided in the bottom plate 52 of the container 44. Fastening tools such as screws are inserted through the fastening holes 88 and fastened to the substrate 34, and thereby the cooling device 42 is secured to the substrate 34. Since the element 36 that is an object of cooling is mounted over the substrate 34 together with the package 40, the cooling device 42 is also secured with respect to the element 36 and the package 40.

The top plate 54 has a shape that does not overlap the fastening holes 88 when seen in a direction in which the top plate 54 is superposed on the bottom plate 52 (an arrow A1 direction illustrated in FIG. 1). Accordingly, when the cooling device 42 is secured to the substrate 34, a fastening operation (for example, an operation of turning the screws) may be performed on the fastening tools without being obstructed by the top plate 54.

As illustrated in FIGS. 1 and 2, fins 90 are attached to the top plate 54. A substantial surface area of the container 44, for example, a heat dissipation area for dissipating heat (air cooling) to the outside is increased by the fins 90. For example, according to the present embodiment, the fins 90 are disposed over the substantially entire region of the top plate 54, and thereby a large heat dissipation area is ensured.

As illustrated in FIG. 5, the container 44 is provided with an injection hole 92 through which the inside and the outside of the container 44 communicate with each other. An injection pipe 96 extends from the injection hole 92 to the outside of the container 44. To inject the refrigerant RF into the container 44, air in the container 44 is discharged by using a vacuum pump or the like. After that, the refrigerant RF is injected into the container 44 through the injection pipe 96. The refrigerant RF in the container 44 is heated and boils, and dissolved air in the refrigerant RF is discharged to the outside of the container 44. However, in a case where a degassed refrigerant from which dissolved air has been removed in advance is used, this operation is not desired. Next, the injection pipe 96 is compressed from the outside and sealed. When a distal end of the injection pipe 96 is filled with a plug (not illustrated), the injection pipe 96 is more strongly sealed. For example, since the injection hole 92 is provided, the refrigerant RF may be injected into the container 44 through the injection hole 92.

Inside the container 44, each of the plurality of recessed portions 84 is filled with the refrigerant RF, and the refrigerant RF is injected such that the liquid level of the refrigerant RF reaches an intermediate position of the inner dimension of the container 44. For example, as illustrated in FIGS. 5 and 8, lower portions of the plurality of pillar members 64 assume a state in which the lower portions of the plurality of pillar members 64 are immersed in the refrigerant RF. When the injection hole 92 is sealed with a plug after the injection, the refrigerant RF may be sealed inside the container 44. Illustration of the injection hole 92 and the injection pipe 96 is omitted in the drawings other than FIG. 5.

Next, operations of the present embodiment are described.

As illustrated in FIGS. 5 and 8, the element 36 is in contact with the heat reception plate 60 via the package 40 and the thermal bonding material 82, and the heat of the element 36 is transferred to the heat reception plate 60 via the package 40 and the thermal bonding material 82.

Figure 9A:
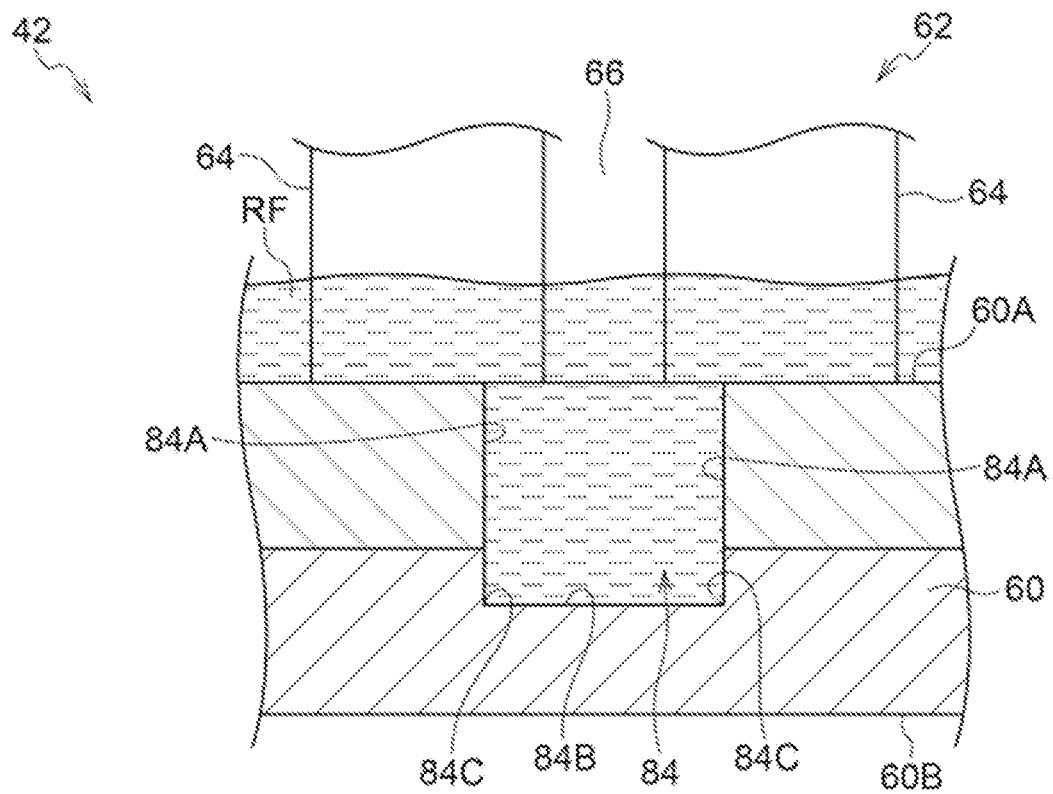
FIG. 9A is an enlarged sectional view illustrating the vicinity of a recessed portion of the cooling device according to the first embodiment in a state in which refrigerant does not boil.

The plurality of recessed portions 84 are formed in the heat reception plate 60. As illustrated in FIG. 9A, the refrigerant RF existing inside each of the recessed portions 84 is located closer to the element 36 than the refrigerant RF existing outside the recessed portion 84, for example, on or above the upper surface 60A of the heat reception plate 60. Accordingly, the heat of the element 36 is easily transferred to the refrigerant RF existing inside the recessed portion 84, and thereby the boiling of the refrigerant RF is facilitated inside the recessed portion 84.

Figure 9B:
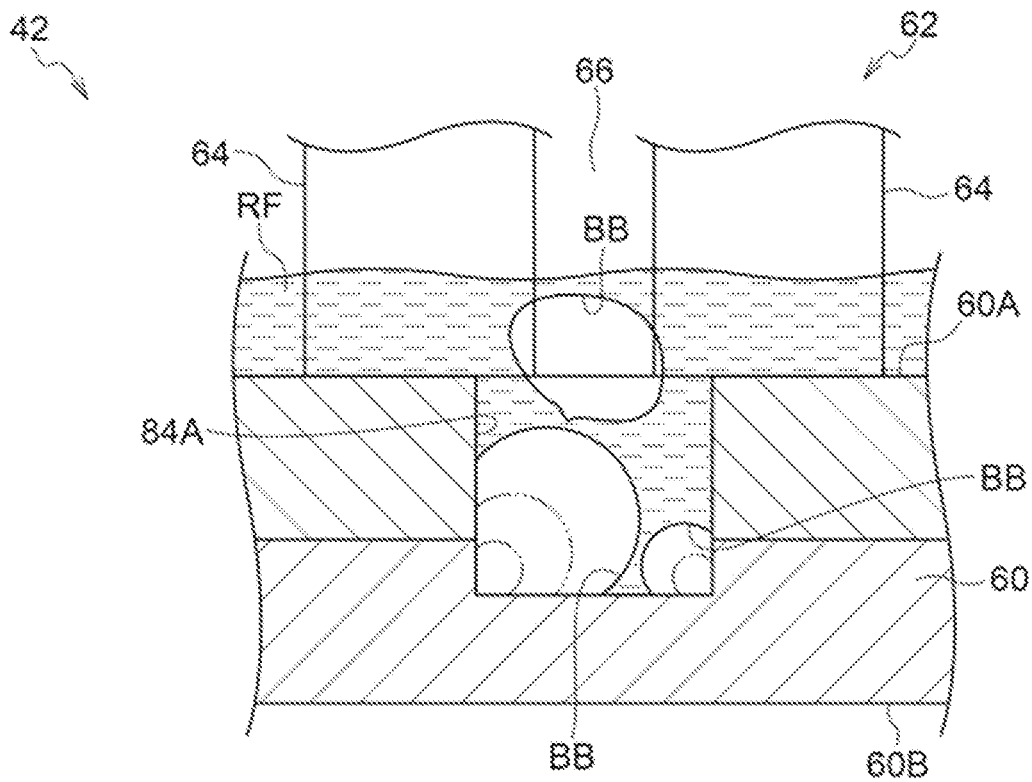
FIG. 9B is an enlarged sectional view illustrating the vicinity of the recessed portion of the cooling device according to the first embodiment in a state in which the refrigerant boils.

For example, as illustrated in FIG. 9B, nucleate boiling of the liquid-phase refrigerant RF occurs inside the recessed portion 84, and air bubbles BB are generated. For example, since a corner portion 84C of the recessed portion 84 is a portion where both a side surface A and a bottom surface B of the recessed portion 84 intersect each other, the degree of superheat (difference between the temperature of the corner portion 84C and the saturation temperature of the refrigerant RF) increases at the start of boiling of the refrigerant RF. At the corner portion 84C, the refrigerant RF is heated from the side surface A and the bottom surface B, and accordingly, the temperature of the refrigerant RF easily increases. Accordingly, a state in which air bubble nuclei are easily generated at the corner portion 84C is realized. Since the degree of superheat of the corner portion 84C is high, the flux of the high-temperature refrigerant RF is easily generated. This is a condition suitable for generation of the heterogeneous nuclei, which is a condition for coalescence and growth of the air bubble nuclei.

The heat transferred from the element 36 to the heat reception plate 60 is further transferred to the pillar members 64. Accordingly, inside the container 44, the liquid-phase refrigerant RF is also vaporized outside the recessed portions 84, for example, in the groove portions 66 between the pillar members 64. The vaporization of the refrigerant RF in the groove portions 66 includes both the evaporation from the surface of the refrigerant RF (see the arrow GF) and the boiling from the inside of the refrigerant RF (see the air bubbles GB). Thus, the gas-phase refrigerant RF is generated inside the container 44.

The gas-phase refrigerant RF diffuses into the diffusion region 68 and moves to the heat dissipation unit 48 through the movement region 74 (see an arrow F1 in FIG. 5). Part of the gas-phase refrigerant RF condenses and liquefies when the heat is dissipated through the fins 90 in the diffusion region 68 and the movement region 74. The refrigerant RF that reaches the heat dissipation unit 48 while being maintained in the gas phase state also condenses and liquefies when this refrigerant RF is cooled via the fins 90 in the heat dissipation unit 48. When the gas-phase refrigerant RF liquefies as described above, the heat of condensation is released from the top plate 54 to the outside of the container 44. As a result, the heat of the element 36 is discharged into the outside air.

As illustrated in FIG. 4, the condensation unit 72 is formed to have a greater width than that of the evaporation unit (or simply, evaporator) 62 in the width direction (arrow W direction). Accordingly, compared to a structure in which the condensation unit 72 does not have a greater width as described above, a large area may be ensured for the heat dissipation from the gas-phase refrigerant RF, and the condensation of the refrigerant RF may be facilitated.

In the container 44, the liquid-phase refrigerant RF flows through the inside of the transport pipes 78 and the spaces 80 between the transport pipes 78 and the bottom plate 52 in the arrow F3 direction illustrated in FIG. 5, and this refrigerant RF is transported toward the evaporation unit 62 by the capillary phenomenon.

In the evaporation unit 62, the liquid-phase refrigerant RF boils again in the recessed portions 84. Also in the groove portion 66, the liquid-phase refrigerant RF evaporates and vaporizes again. As described above, in the container 44, the refrigerant RF is circulated through the evaporation unit 62 and the condensation unit 72 while repeating phase transition between the liquid phase and the gas phase. Thus, the heat received by the heat reception plate 60 may be transferred to the heat dissipation unit 48. As a result, the element 36 that is the object of cooling may be cooled.

As described above, according to the present embodiment, the recessed portions 84 are formed in the heat reception plate 60. Thus, vaporization of the refrigerant RF in the container 44 is facilitated compared to a case where no recessed portion 84 is formed. Since a phase change of the refrigerant RF is facilitated inside the container 44, cooling efficiency of the cooling device 42 improves.

When the liquid-phase refrigerant RF in the container 44 is located at a region close to the element 36, the heat may be efficiently transferred from the element 36 to the refrigerant RF. From such a point of view, for example, the following structure is also conceivable: The thickness of the heat reception plate is entirely reduced to allow the refrigerant RF in the container 44 to exist in a region close to the element 36 throughout a region on the heat reception surface 60B side.

However, when the thickness of the heat reception plate 60 is simply reduced, flexural rigidity of the heat reception plate 60 reduces, and the heat reception plate 60 is easily bent. According to the present embodiment, the thermal bonding material 82 is interposed between the package 40 and the container 44. When the container 44 is pressed against the substrate 34, the thermal bonding material 82 is brought into close contact with the package 40 and the container 44. Accordingly, in a case where the flexural rigidity of the heat reception plate 60 is reduced, pressing the container 44 toward the substrate 34 may cause the heat reception plate 60 to be bent. Even in a case where grooves are formed in the heat reception plate 60, for example, in the upper surface 60A of the heat reception plate 60 such that the grooves extend from one side to an other side of the heat reception plate 60 that faces the one side and the grooves are open at both ends, the flexural rigidity of the heat reception plate 60 locally reduces due to the grooves.

In contrast, according to the present embodiment, the recessed portions 84 of the heat reception plate 60 are partially formed in the heat reception plate 60 in plan view. This is not a shape in which the thickness of the entirety of the heat reception plate 60 is reduced. The recessed portions 84 have a closed shape open to none of the four sides of the heat reception plate 60. Accordingly, reduction of the flexural rigidity of the heat reception plate 60 due to the formation of the recessed portions 84 is suppressed. For example, even in a case where the container 44 is strongly pressed against the substrate 34 to bring the thermal bonding material 82 into close contact with the package 40 and the container 44, bending of the heat reception plate 60 may be suppressed.

When the thermal bonding material 82 is brought into close contact with the package 40 and the container 44, the heat may be efficiently transferred from the element 36 to the container 44.

Even in a structure in which the element 36 is mounted over the substrate 34 with an LGA, the element 36 may be pressed against the substrate 34 via the container 44 and the package 40 while bending of the heat reception plate 60 is suppressed.

Figure 10:
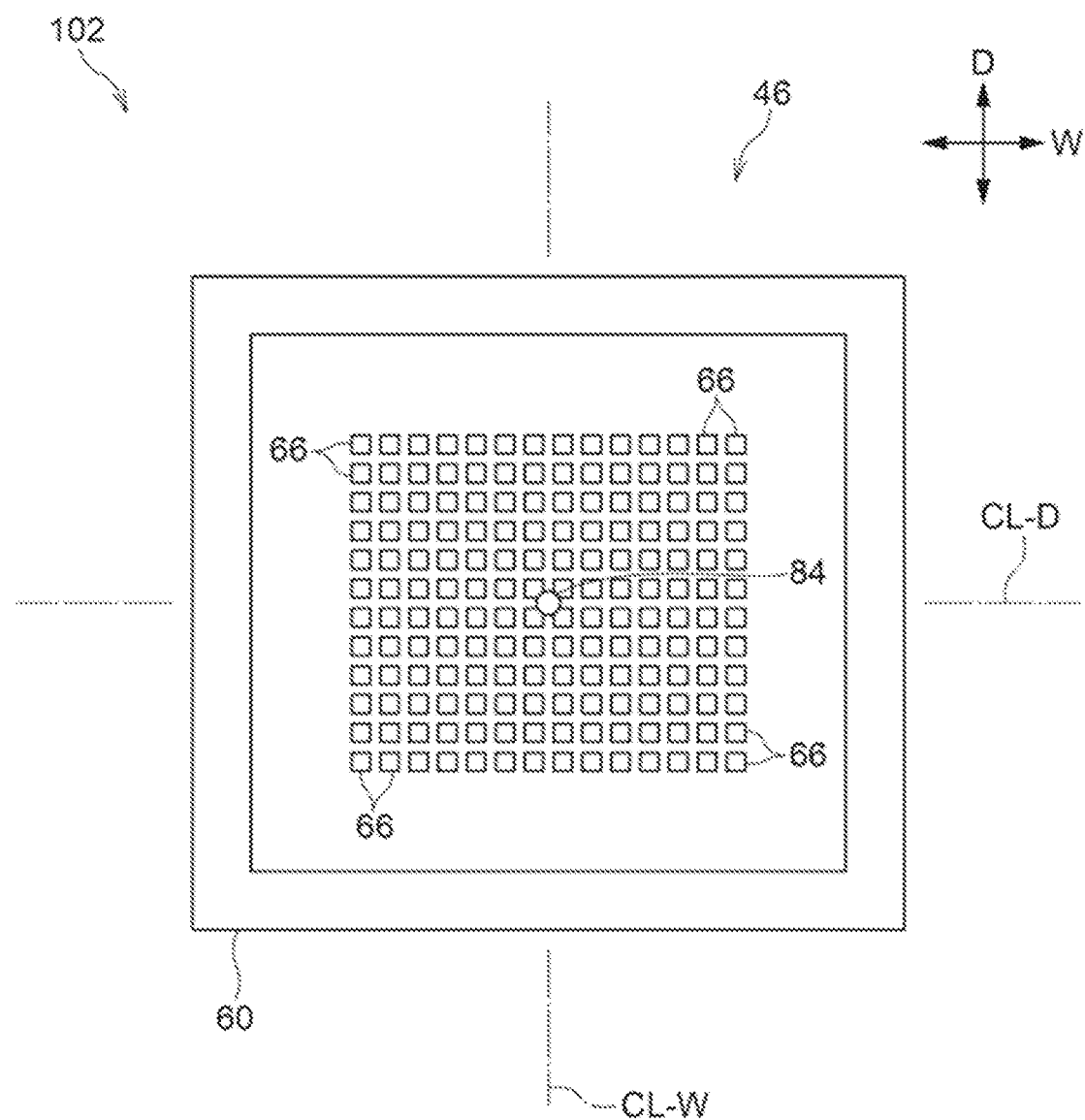
FIG. 10 is an enlarged plan view illustrating the vicinity of the heat reception unit of a cooling device according to a comparative example.
Figure 11:
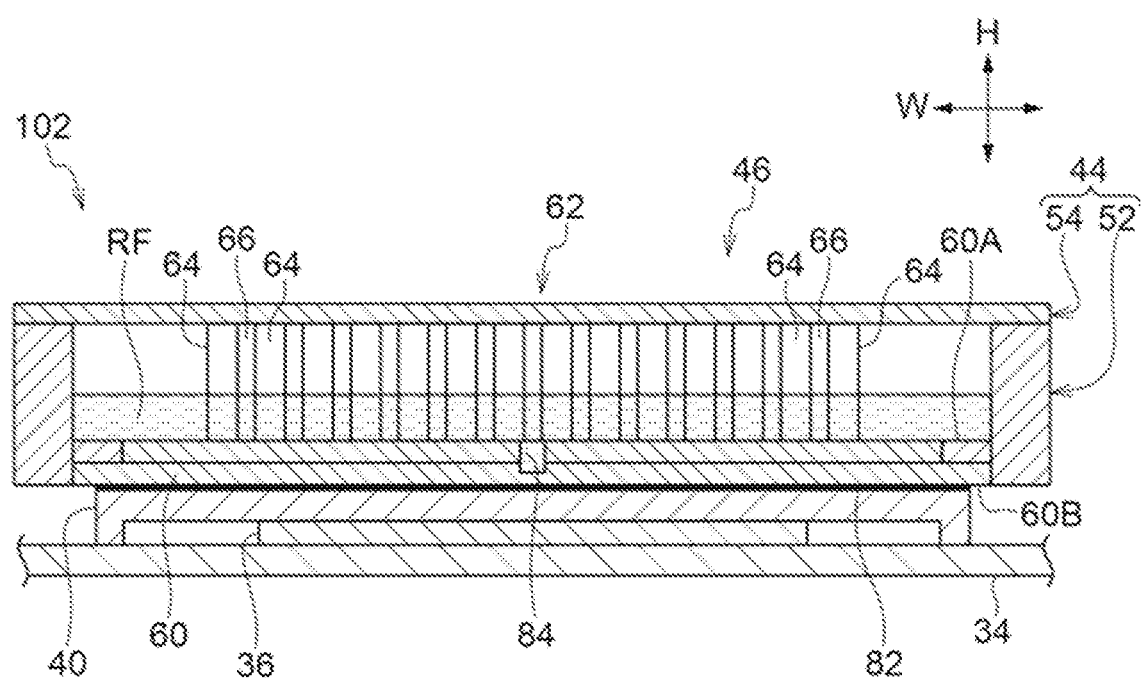
FIG. 11 is an enlarged longitudinal sectional view illustrating the vicinity of the heat reception unit of the cooling device according to the comparative example.

According to the first embodiment, the plurality of recessed portions 84 are provided. FIGS. 10 and 11 illustrate an enlarged view of a cooling device 102 according to a comparative example at the vicinity of the heat reception unit 46.

In the cooling device 102 according to the comparative example, only one recessed portion 84 is formed at the center of the heat reception plate 60 in plan view. Even with such a structure, the liquid-phase refrigerant RF boils in the recessed portion 84.

However, since the cooling device 102 according to the comparative example has a single recessed portion 84, when the entire heat reception plate 60 is considered, the effect of boiling the liquid-phase refrigerant RF in the recessed portion 84 to allow improvement of the cooling efficiency of the cooling device 102 is small compared to that of the structure including the plurality of recessed portions 84.

In contrast, with the technique disclosed herein, since the plurality of recessed portions 84 are provided, compared to the structure with a single recessed portion 84, boiling of a larger amount of the refrigerant RF may be facilitated to allow the improvement of the cooling efficiency of the cooling device 42.

According to the first embodiment, the recessed portions 84 have a columnar shape. Since the recessed portions 84 have a section which is fixed (circular shape) in the thickness direction of the heat reception plate 60, the recessed portions 84 are easily formed. For example, the recessed portions 84 may be easily formed by preparing a plate material in which no recessed portion 84 is formed and both surfaces of which are flat and processing one of the surfaces of the plate material with a drill or the like.

According to the first embodiment, the recessed portions 84 are formed at the positions of the intersections of the groove portions 66 arranged in a grid shape. Since no pillar member 64 exists at the positions of the intersections of the groove portions 66, the recessed portions 84 are easily formed.

According to the first embodiment, the plurality of recessed portions 84 are symmetrically disposed with respect to the center line CL-W and the center line CL-D in plan view of the heat reception plate 60. Since the plurality of recessed portions 84 are not nonuniformity disposed in plan view of the heat reception plate 60, the boiling of the refrigerant RF may be facilitated by the recessed portions 84 without nonuniformity in the heat reception plate 60.

In the example illustrated in FIG. 7 as the cooling device 42 according to the first embodiment, the plurality of recessed portions 84 are formed in a specific pattern in the width direction (arrow W direction) and also in a specific pattern in the depth direction (arrow D direction). Accordingly, when the heat reception plate 60 is seen in plan view, the adjacent recessed portions 84 serve as the vertices of a rectangle.

Figure 12:
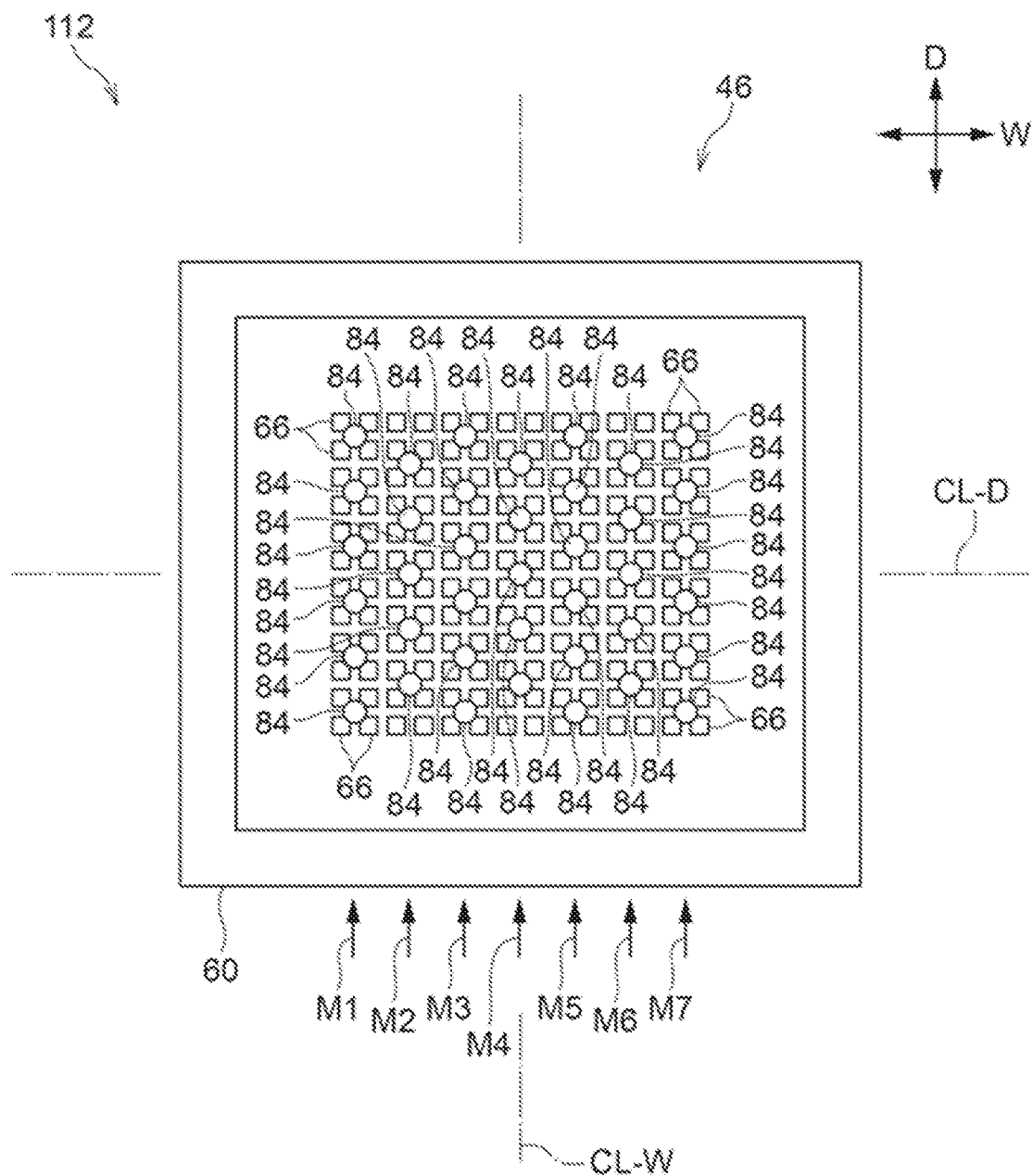
FIG. 12 is an enlarged plan view illustrating the vicinity of the heat reception unit of a cooling device according to a first modification example.

In contrast, as the arrangement of the plurality of recessed portions 84, an arrangement according to a first modification example illustrated in FIG. 12 may be used.

According to modification examples and embodiments described below, an overall structure of the cooling device is similar to that of the first embodiment, and thereby the illustration of the overall structure is omitted. In the following, elements, members, and the like that are the same as those of the first embodiment are denoted by the same reference numerals as those of the first embodiment, and thereby the detailed description of the same elements, members, and the like is omitted.

Rows of the recessed portions 84 in the width direction in plan view of the heat reception plate 60 are discussed in a cooling device 112 according to a first modification example illustrated in FIG. 12. For example, in an example illustrated in FIG. 12, seven rows M1 to M7 of the recessed portions 84 exist in the longitudinal direction. Each of the odd-numbered rows M1, M3, M5, and M7 includes six recessed portions 84 arranged in a pattern at a fixed pitch (at regular intervals) in the depth direction, whereas each of the even-numbered rows M2, M4, and M6 includes five recessed portions 84 arranged in a pattern at a fixed pitch (at regular intervals) in the depth direction. The patterns of the odd-numbered rows and the even-numbered rows are disposed so as to be shifted by half a pitch in the depth direction. Thus, when the plurality of recessed portions 84 are considered as a whole, the recessed portions 84 are arranged such that the positions of the recessed portions 84 are shifted from row to row in the depth direction, which is a so-called staggered arrangement.

Even with such an arrangement of the recessed portions 84, the formation of the recessed portions 84 in the heat reception plate 60 facilitates the vaporization of the refrigerant RF in the container 44. Since the phase change of the refrigerant RF is facilitated inside the container 44, the cooling efficiency of the cooling device 112 improves.

Also according to the first modification example, the plurality of recessed portions 84 are symmetrically disposed with respect to the center line CL-W and the center line CL-D.

Figure 13:
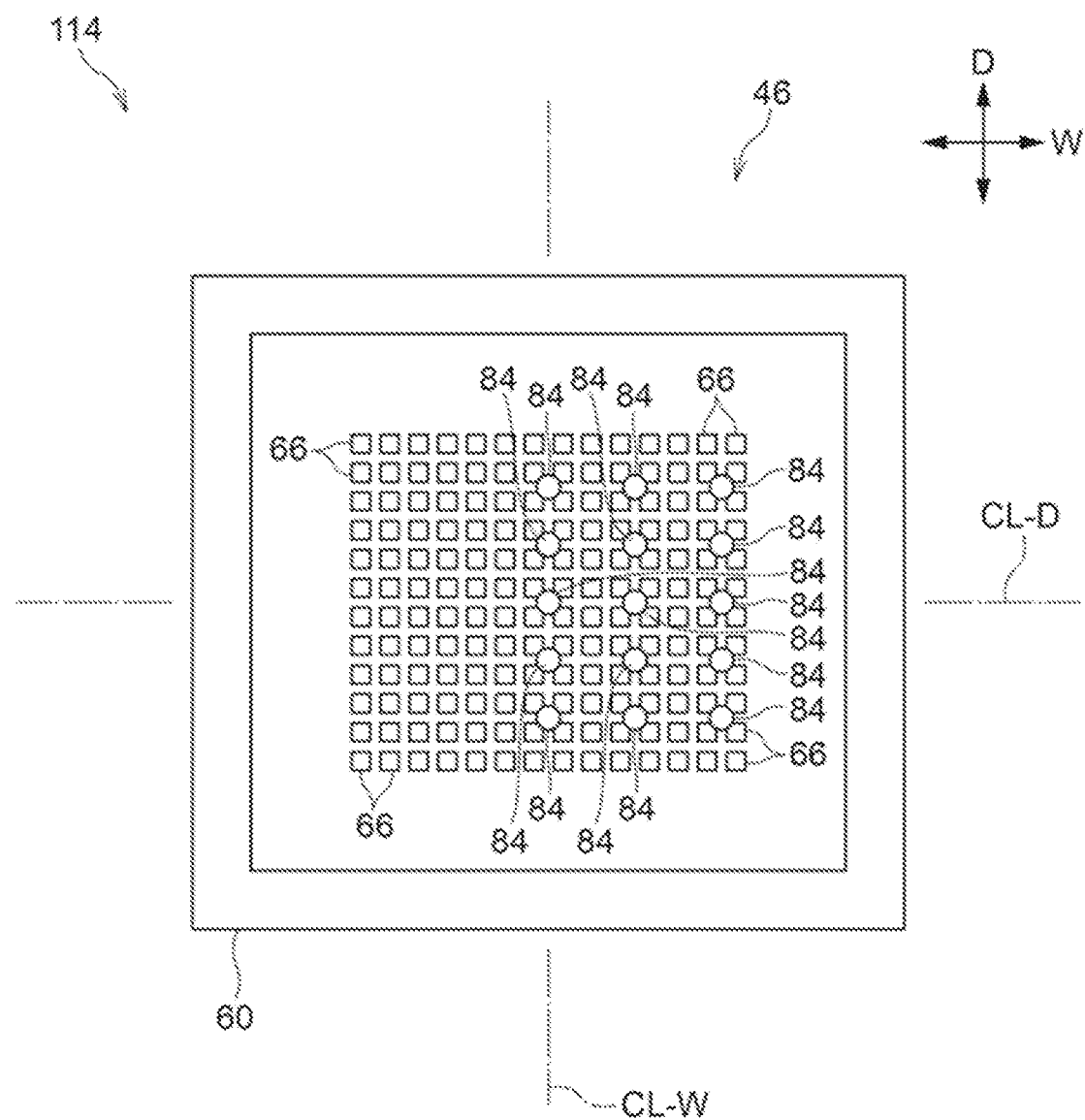
FIG. 13 is an enlarged plan view illustrating the vicinity of the heat reception unit of a cooling device according to a second modification example.

As the arrangement of the plurality of recessed portions 84, an arrangement according to a second modification example illustrated in FIG. 13 may be used.

In a cooling device 114 according to a second modification example illustrated in FIG. 13, in plan view of the heat reception plate 60, the plurality of recessed portions 84 are symmetrically disposed with respect to the center line CL-D and disposed in an unbalanced manner on the right side of the page of FIG. 13 with respect to the center line CL-W. For example, the plurality of recessed portions 84 are disposed on the center line CL-W and in a region on the right side of the center line CL-W.

Figure 14:
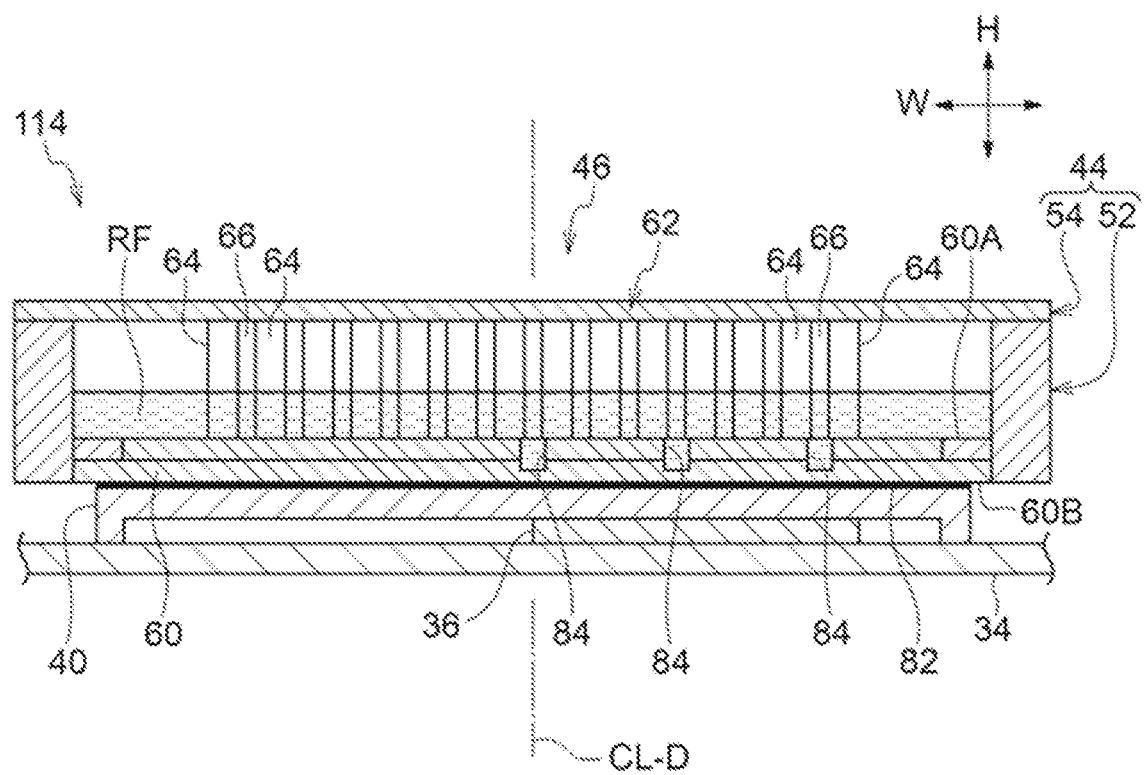
FIG. 14 is an enlarged longitudinal sectional view illustrating the vicinity of the heat reception unit of the cooling device according to the second modification example.

According to the second modification example, as illustrated in FIG. 14, the element 36 is disposed on the right side of the center line CL-D. For example, the plurality of recessed portions 84 are disposed corresponding to the position of the element 36 in a case where the element 36 is positioned on one side. In this way, the refrigerant RF inside the recessed portions 84 may efficiently boils due to the heat of the element 36 arranged on one side.

A specific example of unbalanced disposition of the plurality of recessed portions 84 is not limited to the structure illustrated in FIG. 13. For example, the plurality of recessed portions 84 may be symmetrically disposed with respect to the center line CL-D and disposed in an unbalanced manner with respect to the center line CL-W. Alternatively, the plurality of recessed portions 84 may be asymmetrically disposed with respect to both the center line CL-W and the center line CL-D.

Next, a second embodiment will be described.

Figure 15A:
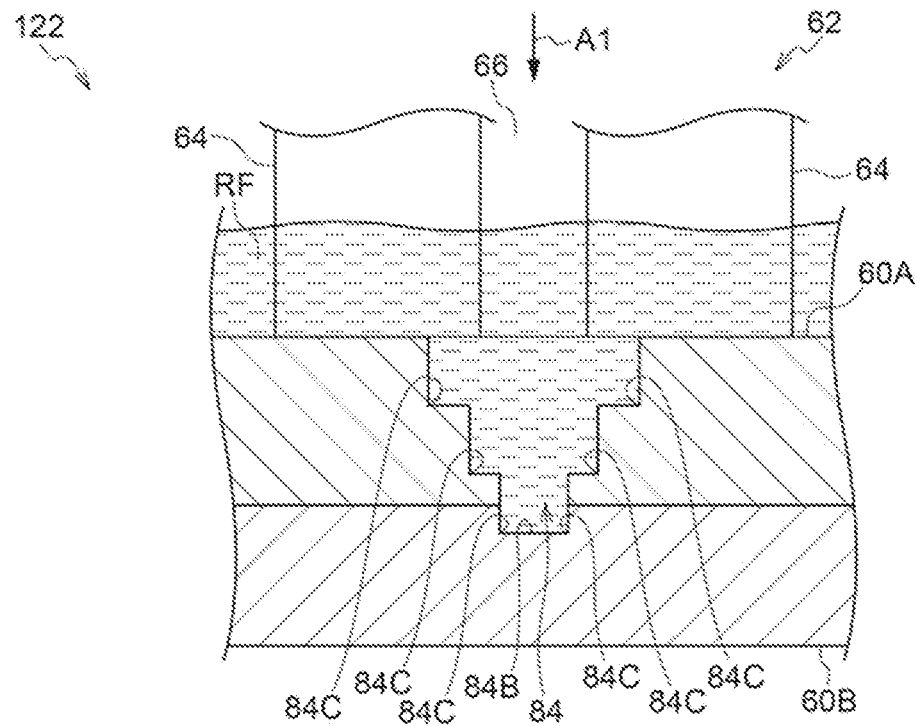
FIG. 15A is an enlarged sectional view illustrating the vicinity of the recessed portion of a cooling device according to a second embodiment in a state in which the refrigerant does not boil.
Figure 15B:
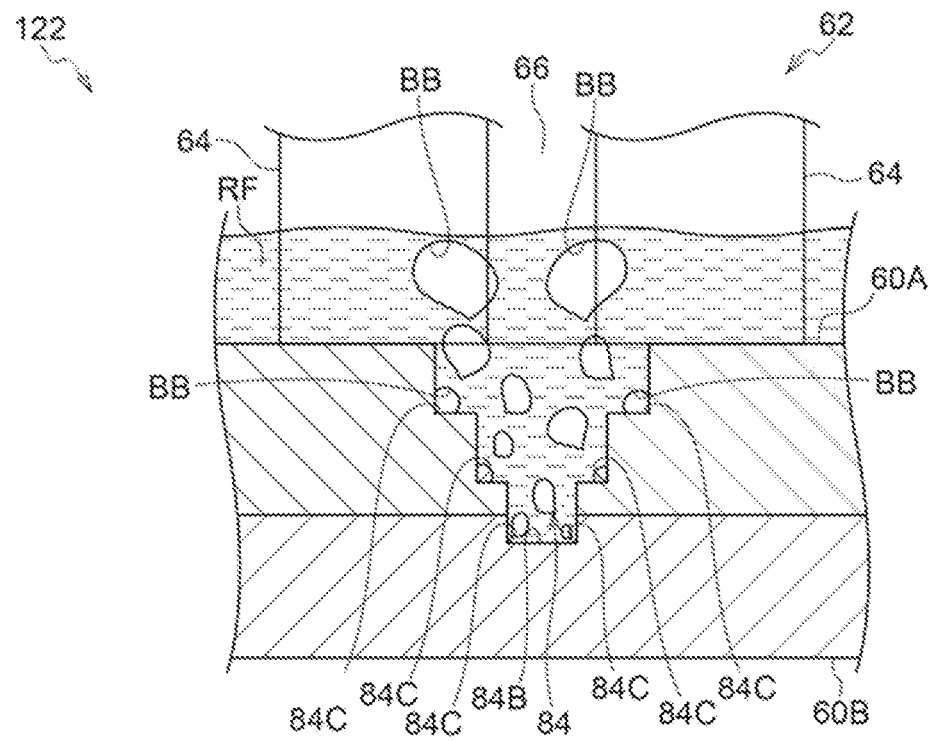
FIG. 15B is an enlarged sectional view illustrating the vicinity of the recessed portion of the cooling device according to the second embodiment in a state in which the refrigerant boils.

As illustrated in FIG. 15A, in a cooling device 122 according to the second embodiment, the recessed portions 84 have a shape in which the inner diameter reduces stepwise toward the heat reception surface 60B. In the example of FIG. 15A, the inner diameter reduces in two steps from the upper surface 60A of the heat reception plate 60 to a bottom surface 84B of the recessed portion 84. Accordingly, when the heat reception plate 60 is seen in a horizontal section, three types of surfaces that reduces in size stepwise toward the heat reception surface 60B appear. When the recessed portion 84 is seen in an arrow A1 direction, a plurality of concentric circles having different inner diameters appear.

Thus, according to the second embodiment, a greater number of corner portions 84C than those of the first embodiment exist in the recessed portion 84 when seen in a vertical section. The corner portions 84C are portions where the air bubble nuclei are generated in a case where the refrigerant RF boils inside the recessed portion 84, for example, a portion where the air bubble nuclei are easily generated. Accordingly, the refrigerant RF easily boils due to the heat received from the element 36, and a structure with a high cooling effect may be realized.

Next, a third embodiment will be described.

Figure 16A:
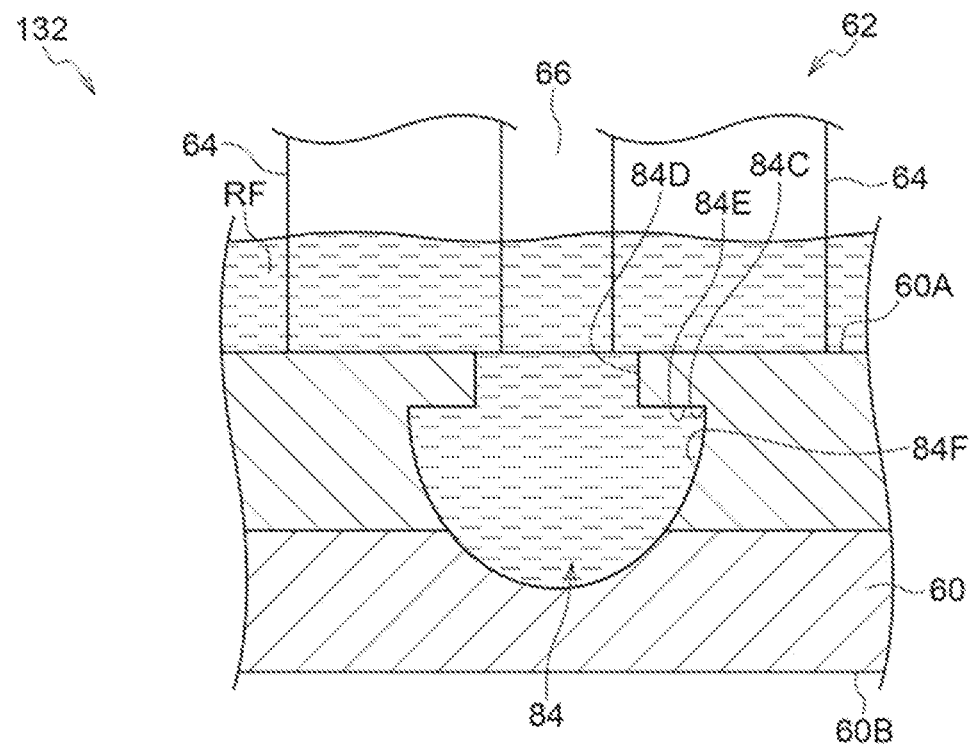
FIG. 16A is an enlarged sectional view illustrating the vicinity of the recessed portion of a cooling device according to a third embodiment in a state in which the refrigerant does not boil.

As illustrated in FIG. 16A, in a cooling device 132 according to the third embodiment, an opening portion 84D of the recessed portion 84 has a columnar shape having a fixed inner diameter. The recessed portion 84 has an enlarged diameter portion 84E enlarged in parallel to the heat reception surface 60B below the opening portion 84D. A curved portion 84F is provided below the enlarged diameter portion 84E. The curved portion 84F is curved in a convex shape toward the heat reception surface 60B when seen in a vertical section. The corner portion 84C exists between the enlarged diameter portion 84E and the curved portion 84F. A section having a shape in which the inside is enlarged more than the opening portion 84D (entrance portion) as described above may be referred to as a re-entrant-type section.

Figure 16B:
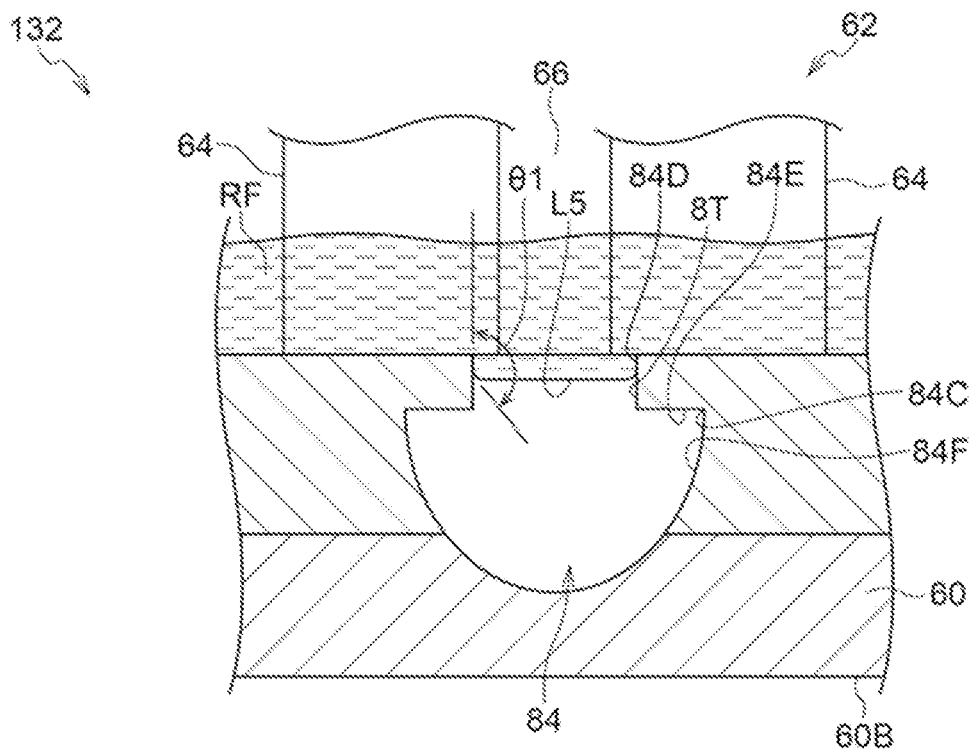
FIG. 16B is an enlarged sectional view illustrating the vicinity of the recessed portion of the cooling device according to the third embodiment in a state in which supplying of the refrigerant to the recessed portion is in progress.
Figure 16C:
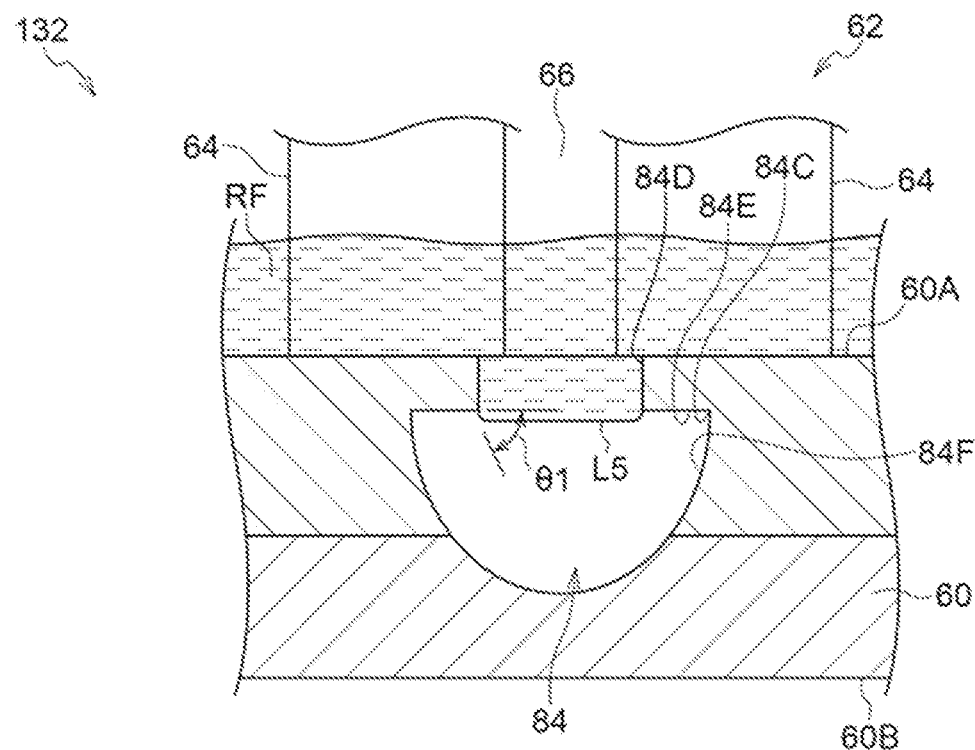
FIG. 16C is an enlarged sectional view illustrating the vicinity of the recessed portion of the cooling device according to the third embodiment in a state in which supplying of the refrigerant to the recessed portion is in progress.
Figure 16D:
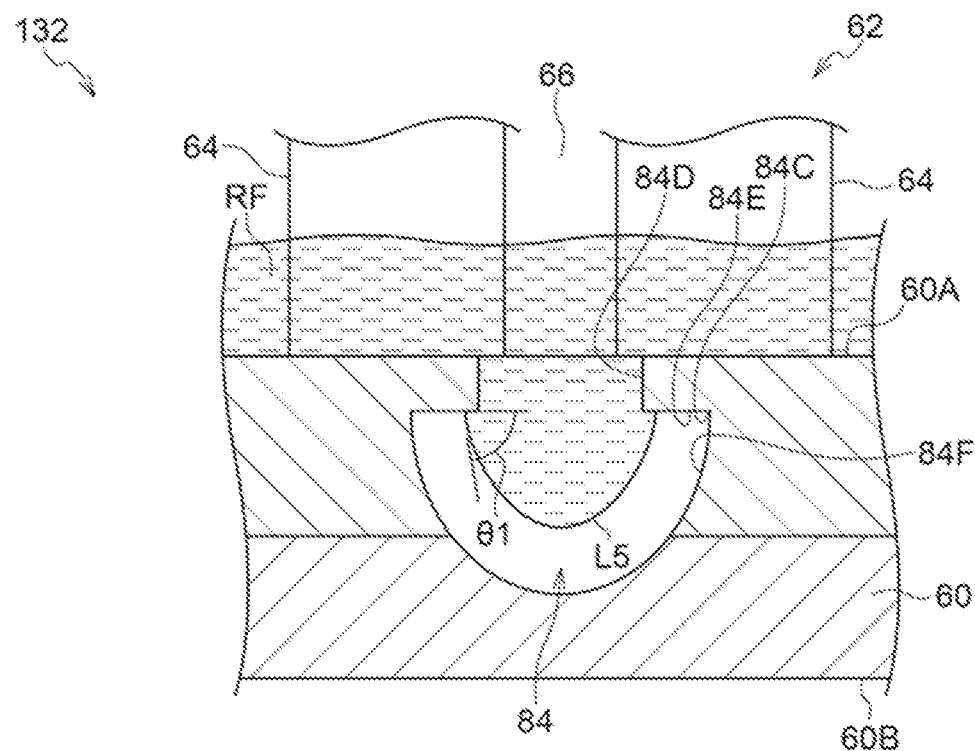
FIG. 16D is an enlarged sectional view illustrating the vicinity of the recessed portion of the cooling device according to the third embodiment in a state in which supplying of the refrigerant to the recessed portion is in progress.

According to the third embodiment, a case where the refrigerant RF is in a supercooled state due to, for example, stopping of heat generation of the element 36 is discussed. In this case, the liquid-phase refrigerant RF enters the recessed portion 84 from the opening portion 84D side as illustrated in FIG. 16B from a state in which the liquid-phase refrigerant RF does not exist temporarily in the recessed portions 84. A liquid level L5 of the liquid-phase refrigerant RF is substantially horizontal in a state in which the liquid level L5 is located in the opening portion 84D as illustrated in FIG. 16B, and a contact angle θ1 of the refrigerant RF is an obtuse angle. As illustrated in FIG. 16C, when the liquid level L5 reaches the enlarged diameter portion 84E, the contact angle θ1 of the refrigerant RF in the enlarged diameter portion 84E becomes an acute angle. In a state in which the liquid level L5 progresses through the enlarged diameter portion 84E toward the outside of the recessed portion 84, as illustrated in FIG. 16D, the liquid-phase refrigerant RF enters the curved portion 84F while the liquid level L5 is curved in a downward convex shape. The gas-phase refrigerant RF exists in a saturated state between the liquid level L5 and the curved portion 84F.

Figure 16E:
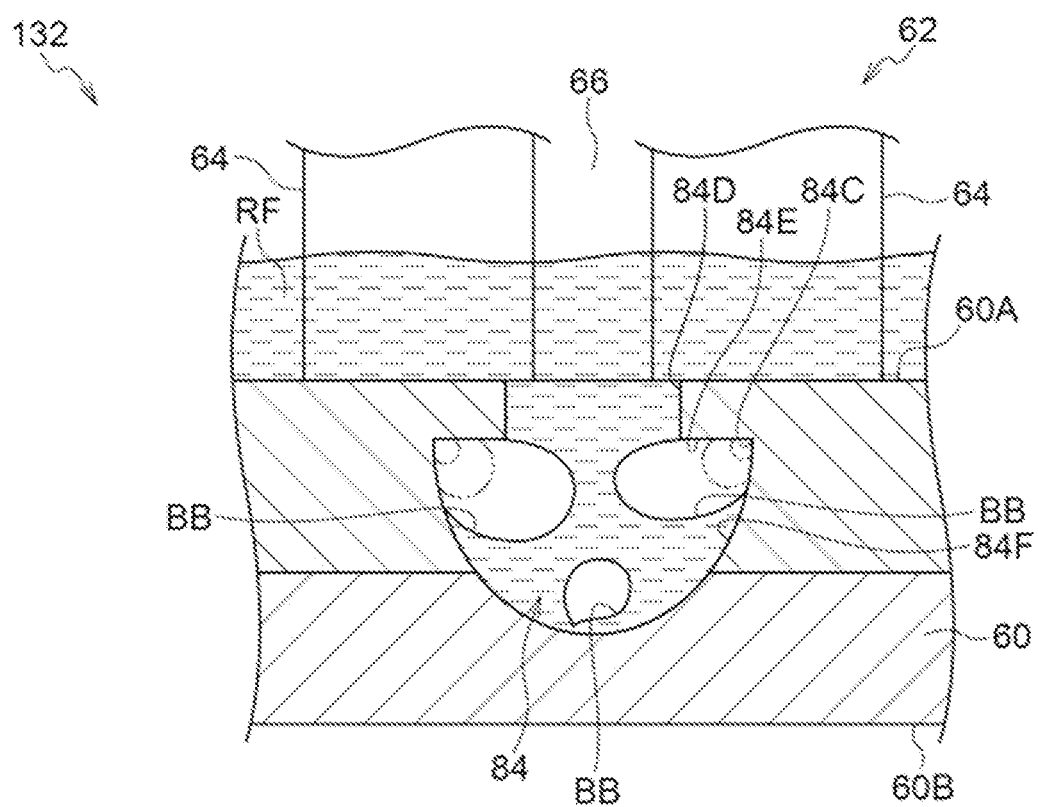
FIG. 16E is an enlarged sectional view illustrating the vicinity of the recessed portion of the cooling device according to the third embodiment in a state in which the refrigerant boils.

Thus, according to the third embodiment, even in the state in which the liquid level LS reaches the curved portion 84F, the curved portion 84F and the corner portion 84C are in a state in which the air bubble nuclei easily exist. Accordingly, as illustrated in FIG. 16E, since the air bubble nuclei are easily generated in the recessed portion 84, for example, in the corner portion 84C and the curved portion 84F, the degree of superheat of a heat transfer surface in the recessed portion 84 may be suppressed to a low degree.

Next, a fourth embodiment will be described.

Figure 17A:
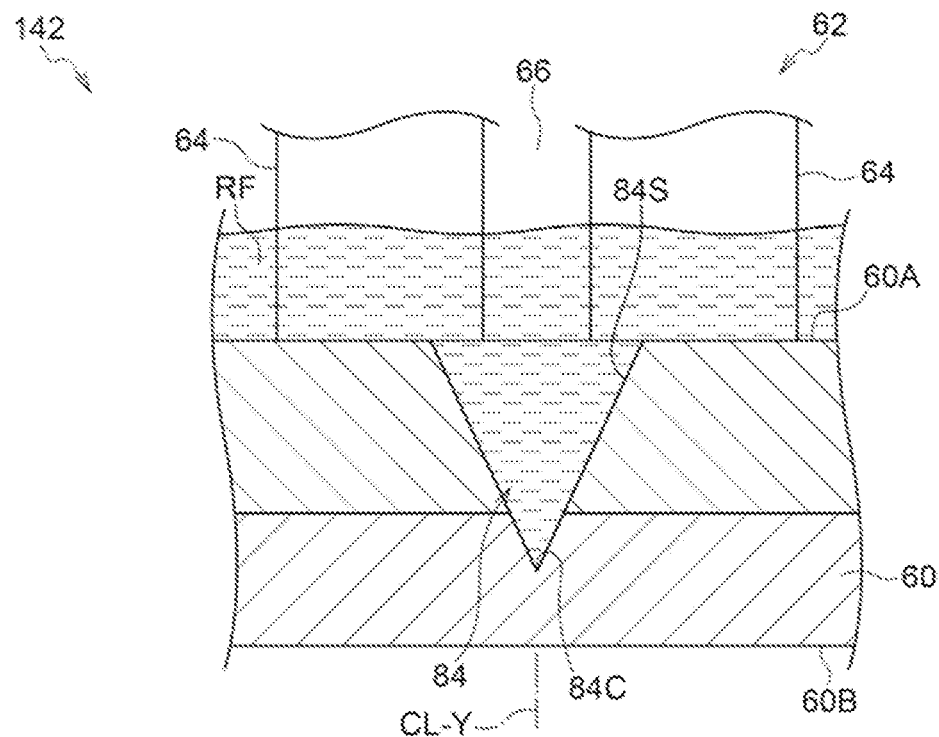
FIG. 17A is an enlarged sectional view illustrating the vicinity of the recessed portion of a cooling device according to a fourth embodiment in a state in which the refrigerant does not boil.

As illustrated in FIG. 17A, in a cooling device 142 according to the fourth embodiment, the recessed portion 84 has a conical shape. For example, when the recessed portion 84 is seen in a vertical section, the recessed portion 84 has a triangular shape directed toward the heat reception surface 60B, and the vertex at a lower end of the triangle is the corner portion 84C. An opening section of the recessed portion 84 continuously reduces toward the heat reception surface 60B. For example, a side surface 84S of the recessed portion 84 is bilaterally symmetrical with respect to a center line CL-Y that passes through the corner portion 84C and inclined relative to the center line CL-Y.

Figure 17B:
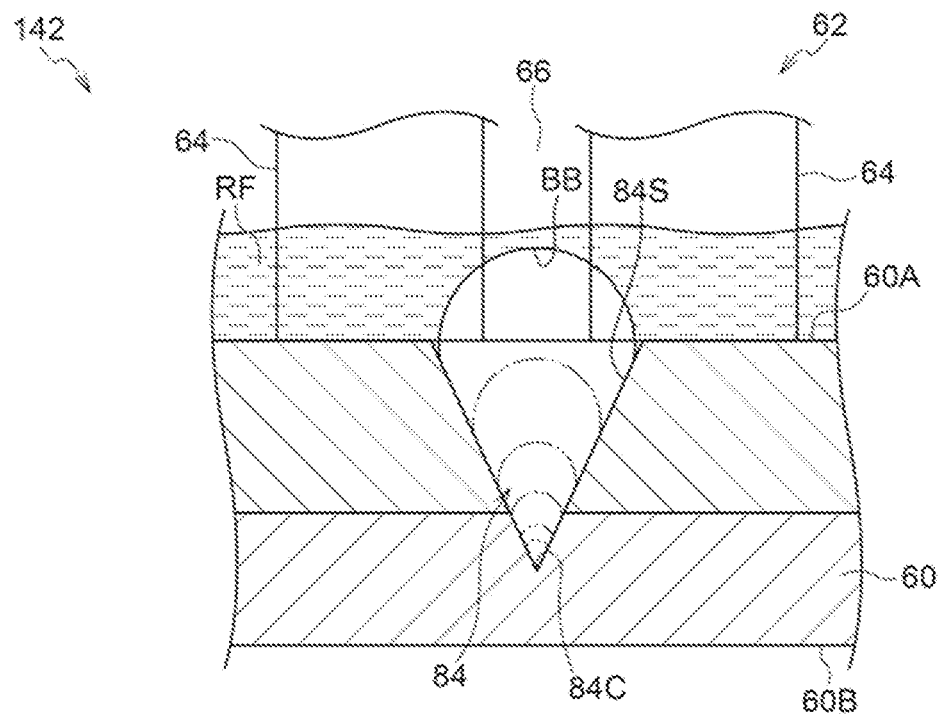
FIG. 17B is an enlarged sectional view illustrating the vicinity of the recessed portion of the cooling device according to the fourth embodiment in a state in which the refrigerant boils.

Thus, according to the fourth embodiment, as illustrated in FIG. 17B, an air bubble BB generated in the corner portion 84C grows while being in contact with the side surface 84S of the recessed portion 84. In a case where the air bubble BB grows as described above, the liquid-phase refrigerant RF recedes upward. Since the side surface 84S is inclined relative to the vertical plane, a reducing contact angle θ1 of the refrigerant RF is easily maintained at a fixed value. When the liquid level LS (a gas-liquid interface between the gas-phase refrigerant RF and the liquid-phase refrigerant RF) on the left side and that on the right side of the page of FIG. 17B are equalized, the area of the liquid level LS may be increased (preferably maximized). In this structure, the air bubble BB easily grows.

Next, a fifth embodiment will be described.

Figure 18A:
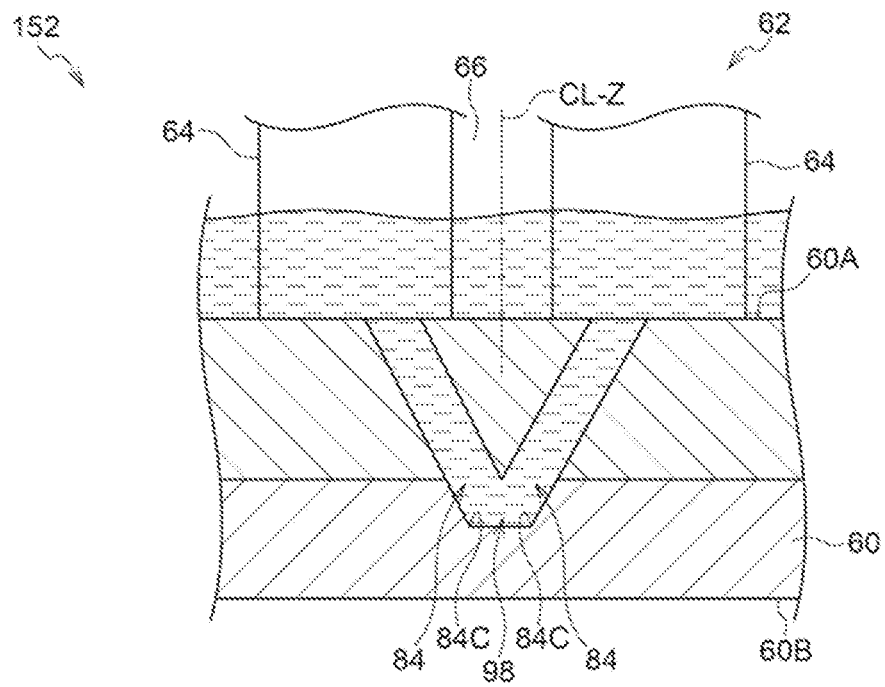
FIG. 18A is an enlarged sectional view illustrating the vicinity of the recessed portion of a cooling device according to a fifth embodiment in a state in which the refrigerant does not boil.

As illustrated in FIG. 18A, in a cooling device 152 according to the fifth embodiment, the plurality of (two in an example of FIG. 18A) recessed portions 84 communicate with each other at a lower portion of each of these recessed portions 84. For example, the lower portion of each of these recessed portions 84 is a communication portion 98 that causes the recessed portions 84 to communicate with each other. According to the fifth embodiment, two recessed portions 84 are symmetrically formed with respect to a center line CL-Z that passes through the communication portion 98, and the recessed portions 84 are inclined relative to the heat reception surface 60B.

Figure 18B:
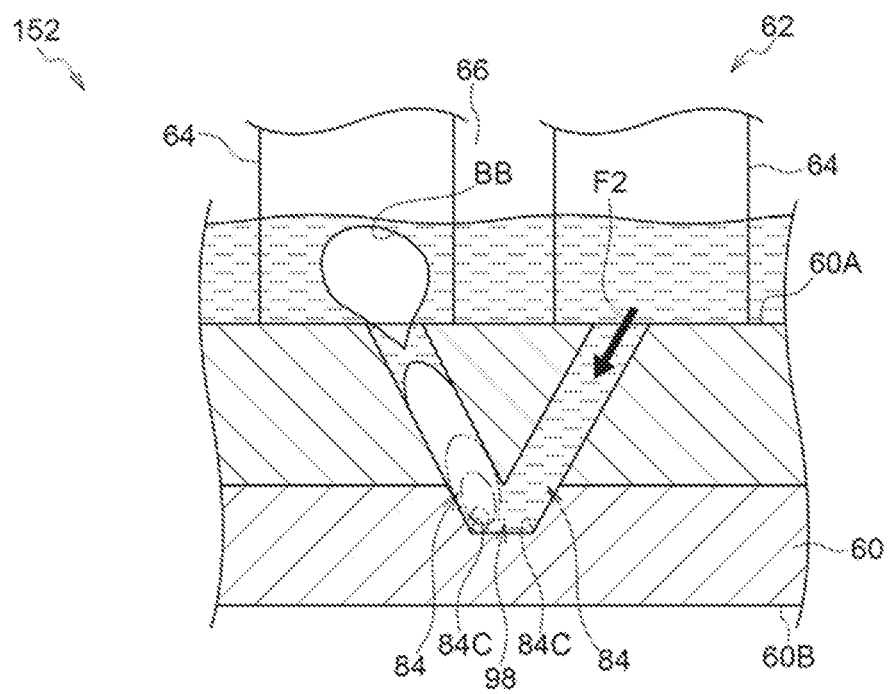
FIG. 18B is an enlarged sectional view illustrating the vicinity of the recessed portion of the cooling device according to the fifth embodiment in a state in which the refrigerant boils.

Thus, according to the fifth embodiment, in a case where the air bubble BB generated in one of the recessed portions 84 (the recessed portion 84 on the left side of the page of FIG. 18B) ascends, as the air bubble BB ascends in this recessed portion 84, the liquid-phase refrigerant RF enters the other recessed portion 84 (the recessed portion 84 on the right side of the page of FIG. 18B) from above as indicated by an arrow F2. For example, even in a case where the refrigerant RF having boiled in the recessed portion 84 is discharged from the recessed portion 84, a new liquid-phase refrigerant RF is supplied into the recessed portion 84.

All of the plurality of recessed portions 84 that communicate with each other through the communication portion 98 are inclined relative to the heat reception surface 60B. Thus, even in a case where the air bubble BB is generated in any of the plurality of recessed portions 84, this structure facilitates the entrance of the liquid-phase refrigerant RF from the other recessed portion.

Next, a sixth embodiment will be described.

Figure 19A:
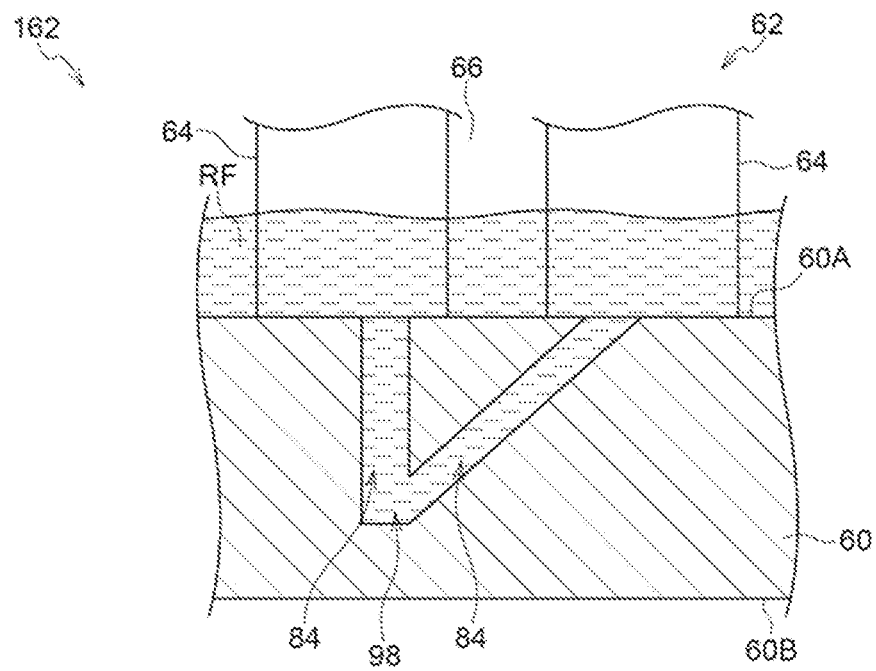
FIG. 19A is an enlarged sectional view illustrating the vicinity of the recessed portion of a cooling device according to a sixth embodiment in a state in which the refrigerant does not boil.
Figure 19B:
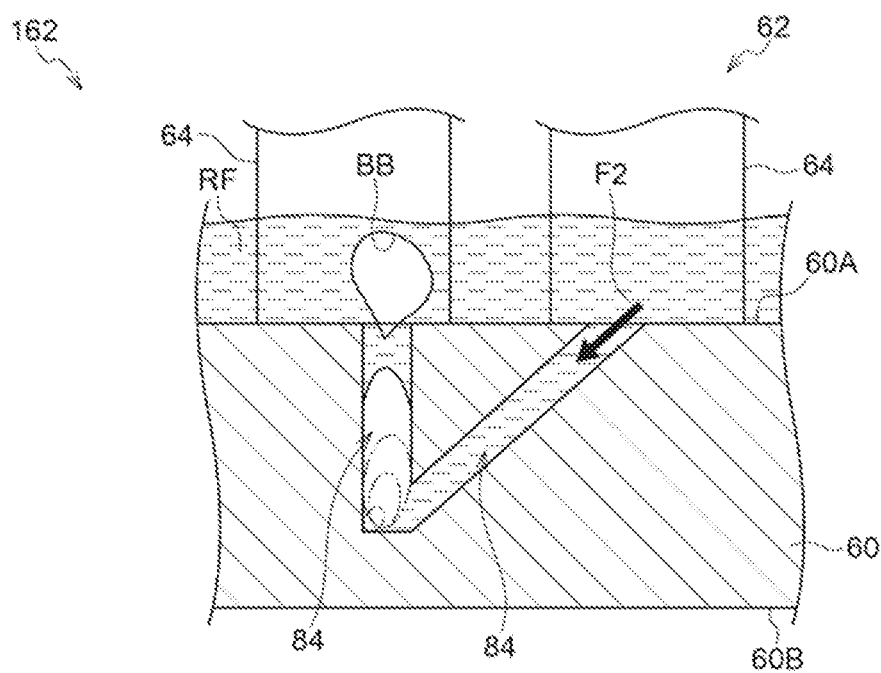
FIG. 19B is an enlarged sectional view illustrating the vicinity of the recessed portion of the cooling device according to the sixth embodiment in a state in which the refrigerant boils.

As illustrated in FIG. 19A, in a cooling device 162 according to the sixth embodiment, the plurality of recessed portions 84 communicate with each other at a lower portion of each of these recessed portions 84 through the communication portion 98. A subset (the recessed portion 84 on the left side of the page of FIG. 19A) of the plurality of recessed portions 84 that communicate with each other through the communication portion 98 extend perpendicular to the heat reception surface 60B, and the other recessed portion 84 (the recessed portion 84 on the right side of the page of FIG. 19B) is inclined relative to the heat reception surface 60B.

Thus, according to the sixth embodiment, the air bubble BB easily ascends in the recessed portion 84 perpendicular to the heat reception surface 60B. As indicated by an arrow F2, the liquid-phase refrigerant RF enters, from above, the recessed portion 84 inclined relative to the heat reception surface 60B. As described above, according to the sixth embodiment, a structure may be realized in which the generated air bubble easily escapes upward in a subset of the plurality of recessed portions 84, and the liquid-phase refrigerant RF is easily supplied to the other recessed portion 84.

Next, a seventh embodiment will be described.

Figure 20A:
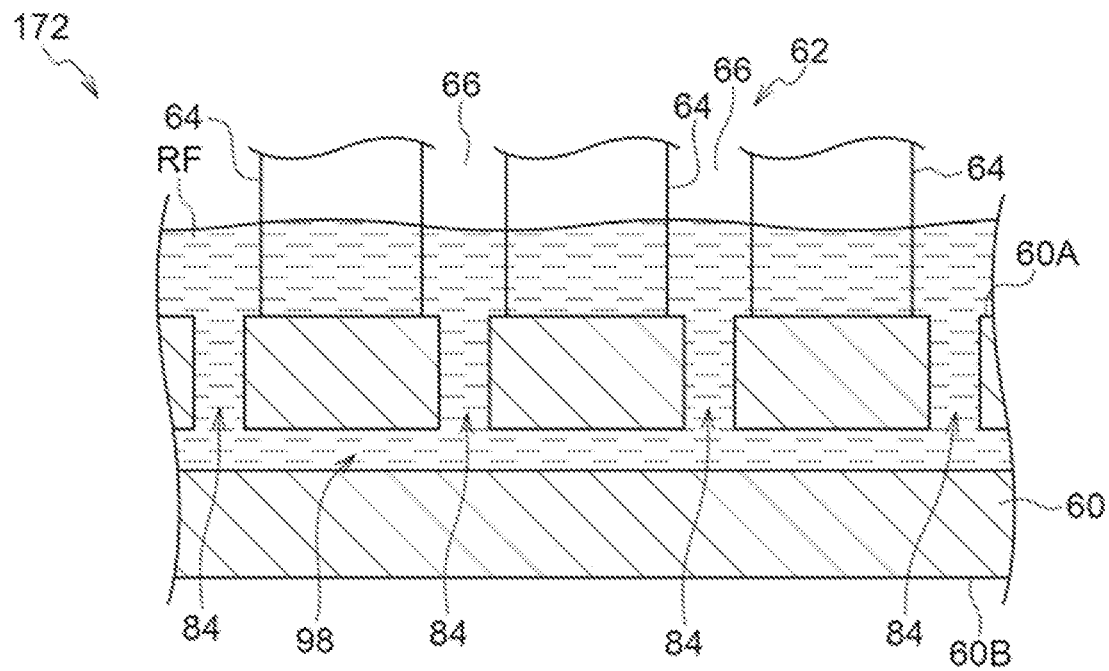
FIG. 20A is an enlarged sectional view illustrating the vicinity of the recessed portion of a cooling device according to a seventh embodiment in a state in which the refrigerant does not boil.
Figure 20B:
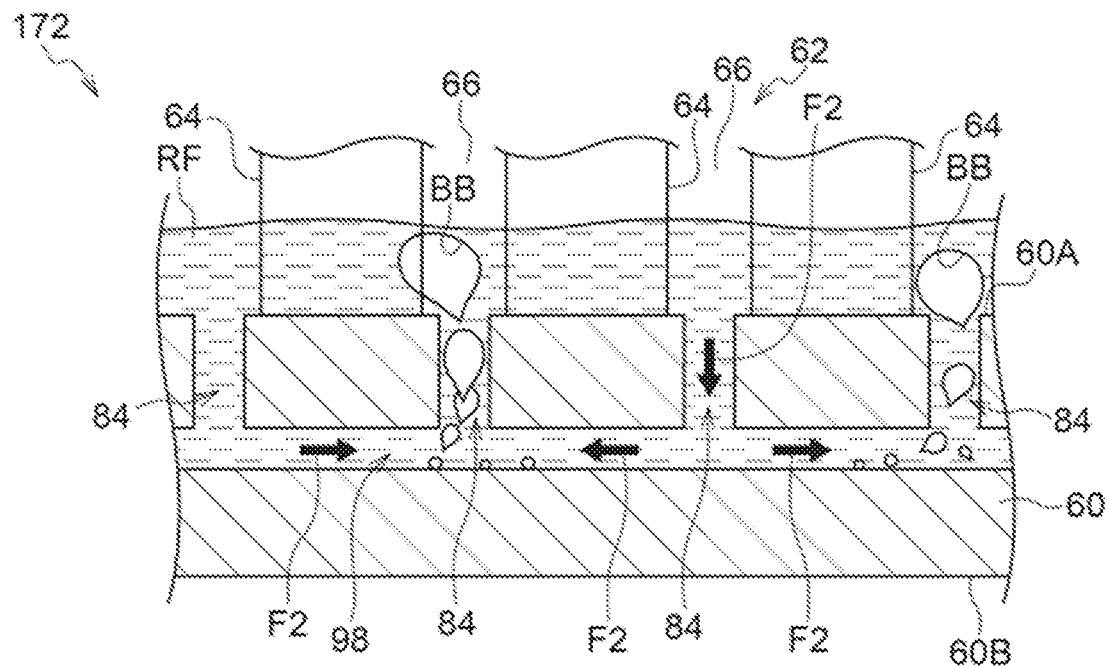
FIG. 20B is an enlarged sectional view illustrating the vicinity of the recessed portion of the cooling device according to the seventh embodiment in a state in which the refrigerant boils.

As illustrated in FIG. 20A, in a cooling device 172 according to the seventh embodiment, the plurality of recessed portions 84 communicate with each other at a bottom portion of each of these recessed portions 84 through the communication portion 98. The communication portion 98 according to the seventh embodiment extends along the heat reception surface 60B, for example, in parallel to the heat reception surface 60B. In an example illustrated in FIG. 20B, the communication portion 98 allows communication between at least four recessed portions 84. The communication portion 98 may further allow communication between four or more recessed portions 84, for example, recessed portions (not illustrated) on the right side and the left side of these four recessed portions 84.

Thus, according to the seventh embodiment, in a case where the air bubble BB is generated and escapes upward in one of the plurality of recessed portions 84 communicating with each other through the communication portion 98, the liquid-phase refrigerant RF enters from the other recessed portion 84. Since the communication portion 98 is formed along the heat reception surface 60B and extends horizontally, a structure is obtained which is unlikely to exhibit nonuniformity in ease of flowing of the liquid-phase refrigerant RF between the plurality of recessed portions 84.

How the plurality of recessed portions 84 having the shapes described in the second to seventh embodiments are disposed in plan view of the heat reception plate 60 is not particularly limited. For example, the plurality of recessed portions 84 having various shapes described in the second to seventh embodiments may be disposed as illustrated in, for example, FIG. 7, FIG. 12, and FIG. 13.

Although the pillar members 64 are described as the members for forming the groove portions 66 in the evaporation unit 62 in the above description, the members forming the groove portions 66 are not limited to these pillar members. For example, a structure in which a plurality of wall members extending in the depth direction are arranged at regular intervals in the width direction may be used. With the structure including the wall members, groove portions extending in the depth direction are formed between the wall members.

Although the embodiments of the technique disclosed herein have been described, the technique disclosed herein is not limited to the above description. Of course, in addition to the above description, the technique disclosed herein is able to be varied and carried out in a variety of manners without departing from the gist thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling device comprising:
   a container in which refrigerant is sealed;
   a heat reception plate that forms part of the container and that receives heat from a heat generating element;
   an evaporator that causes the refrigerant in a liquid phase to evaporate with heat reception in the container;
   a condenser that causes the refrigerant in a gas phase to condense with heat dissipation in the container; and
   a plurality of recessed portions formed in a surface of the heat reception plate inside the container, each of the plurality of recessed portions having at least one corner portion configured to facilitate the generation of refrigerant vapor nuclei to promote boiling of the refrigerant.

2. The cooling device according to claim 1, further comprising:
   a plurality of pillar members that stand erect from the heat reception plate toward an inside of the container and that partition the inside of the container into a plurality of groove portions arranged in a grid shape.

3. The cooling device according to claim 2, wherein
   the plurality of groove portions intersect each other, and
   each of the plurality of recessed portions is formed at a position of a corresponding one of a plurality of intersections of the plurality of groove portions.

4. The cooling device according to claim 3, wherein
   the plurality of recessed portions are disposed symmetrically with respect to a center line of the heat reception plate in plan view of the heat reception plate.

5. The cooling device according to claim 3, wherein
   the plurality of recessed portions are disposed in an unbalanced manner with respect to a center line of the heat reception plate in plan view of the heat reception plate.

6. The cooling device according to claim 3, wherein
   the plurality of recessed portions are disposed in a fixed pattern in one direction out of a longitudinal direction and a lateral direction in plan view of the heat reception plate, and the plurality of recessed portions are disposed in an other direction out of the longitudinal direction and the lateral direction such that the pattern is shifted in the one direction.

7. The cooling device according to claim 1, wherein
   the plurality of recessed portions have a fixed opening section toward a heat reception surface of the heat reception plate.

8. The cooling device according to claim 1, wherein
   the plurality of recessed portions have an opening section that reduces stepwise toward a heat reception surface of the heat reception plate.

9. The cooling device according to claim 1, wherein
   the plurality of recessed portions have an opening section that is shaped so as to be partially enlarged from an opening portion inside the container toward a heat reception surface of the heat reception plate.

10. The cooling device according to claim 1, wherein
    the plurality of recessed portions have an opening section that continuously reduces toward a heat reception surface of the heat reception plate.

11. The cooling device according to claim 1, further comprising:
    a communication portion that allows the plurality of recessed portions to communicate with each other in the heat reception plate.

12. The cooling device according to claim 11, wherein
    the recessed portions that communicate with each other through the communication portion are each inclined relative to a heat reception surface of the heat reception plate.

13. The cooling device according to claim 11, wherein
    one recessed portion out of the recessed portions that communicate with each other through the communication portion is perpendicular to a heat reception surface of the heat reception plate, and an other recessed portion of the recessed portions that communicate with each other through the communication portion is inclined relative to the heat reception surface.

14. The cooling device according to claim 11, wherein
    the communication portion is formed in the heat reception plate along a heat reception surface of the heat reception plate and couples the plurality of recessed portions to each other.

* * * * *